(12) United States Patent
Chang et al.

(10) Patent No.: US 12,402,450 B2
(45) Date of Patent: Aug. 26, 2025

(54) DISPLAY DEVICE

(71) Applicant: LG ELECTRONICS INC., Seoul (KR)

(72) Inventors: Wonjae Chang, Seoul (KR); Chilkeun Park, Seoul (KR); Jaewon Chang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/709,423

(22) PCT Filed: Nov. 12, 2021

(86) PCT No.: PCT/KR2021/016568
§ 371 (c)(1),
(2) Date: May 10, 2024

(87) PCT Pub. No.: WO2023/085473
PCT Pub. Date: May 19, 2023

(65) Prior Publication Data
US 2024/0421258 A1    Dec. 19, 2024

(51) Int. Cl.
*H10H 20/832* (2025.01)
*H01L 23/00* (2006.01)
*H01L 25/075* (2006.01)
*H10H 20/831* (2025.01)
*H10H 20/84* (2025.01)
*H10H 20/857* (2025.01)

(52) U.S. Cl.
CPC ........ *H10H 20/835* (2025.01); *H01L 24/95* (2013.01); *H01L 25/0753* (2013.01); *H10H 20/8314* (2025.01); *H10H 20/84* (2025.01); *H10H 20/857* (2025.01)

(58) Field of Classification Search
None
See application file for complete search history.

(56) References Cited

U.S. PATENT DOCUMENTS

| 10,825,702 B2 | 11/2020 | Shim et al. | |
| 2003/0107316 A1* | 6/2003 | Murakami | H01L 33/62 257/E33.072 |

(Continued)

FOREIGN PATENT DOCUMENTS

| KR | 10-2012-0052745 A | 5/2012 |
| KR | 10-2018-0082003 A | 7/2018 |

(Continued)

OTHER PUBLICATIONS

International Search Report (PCT/ISA/210), issued in PCT/KR2021/016568, dated Aug. 9, 2022.

*Primary Examiner* — Feifei Yeung Lopez
(74) *Attorney, Agent, or Firm* — Birch, Stewart, Kolasch & Birch, LLP

(57) ABSTRACT

The display device includes a substrate, a first and second assembly wirings on the substrate, a partition having a hole on the first and second assembly wirings, and a semiconductor light emitting device in the hole, wherein the hole configured to have an inner side with a first obtuse angle to a lower side, and wherein the semiconductor light emitting device configured to have at least one side having a second obtuse angle with respect to the lower side.

20 Claims, 13 Drawing Sheets

(56) References Cited

U.S. PATENT DOCUMENTS

| | | | |
|---|---|---|---|
| 2008/0251796 A1* | 10/2008 | Lee | H01L 33/62 257/E33.064 |
| 2009/0039371 A1* | 2/2009 | Kim | H10H 20/835 257/98 |
| 2009/0267096 A1* | 10/2009 | Kim | H01L 33/382 257/98 |
| 2012/0040479 A1* | 2/2012 | Kim | H01L 33/0093 257/E33.056 |
| 2014/0159043 A1* | 6/2014 | Sakariya | H01L 25/0753 438/34 |
| 2014/0367705 A1* | 12/2014 | Bibl | H01L 24/95 438/27 |
| 2019/0006564 A1 | 1/2019 | Sasaki et al. | |
| 2020/0235077 A1 | 7/2020 | Jeon et al. | |
| 2020/0403118 A1 | 12/2020 | Kim et al. | |
| 2022/0230997 A1 | 7/2022 | Cho | |
| 2022/0352446 A1 | 11/2022 | Chung et al. | |
| 2022/0367774 A1 | 11/2022 | Kim et al. | |
| 2023/0107331 A1 | 4/2023 | Heo et al. | |
| 2023/0109184 A1* | 4/2023 | Hong | H01L 33/62 257/91 |
| 2023/0110862 A1 | 4/2023 | Kim et al. | |
| 2023/0126933 A1* | 4/2023 | An | H01L 25/0753 257/79 |
| 2023/0130868 A1* | 4/2023 | Yang | H01L 25/0753 257/89 |
| 2023/0138336 A1* | 5/2023 | Moon | H01L 25/0753 257/91 |
| 2024/0186472 A1* | 6/2024 | Yoon | H10D 86/60 |

FOREIGN PATENT DOCUMENTS

| | | |
|---|---|---|
| KR | 10-2018-0089771 A | 8/2018 |
| KR | 10-2019-0012030 A | 2/2019 |
| KR | 10-2019-0017691 A | 2/2019 |
| KR | 10-2019-0076929 A | 7/2019 |
| KR | 10-2019-0106885 A | 9/2019 |
| KR | 10-2019-0113695 A | 10/2019 |
| KR | 10-2061409 B1 | 12/2019 |
| KR | 10-2020-0023328 A | 3/2020 |
| KR | 10-2020-0026679 A | 3/2020 |
| KR | 10-2020-0026845 A | 3/2020 |

\* cited by examiner

[FIG. 1]
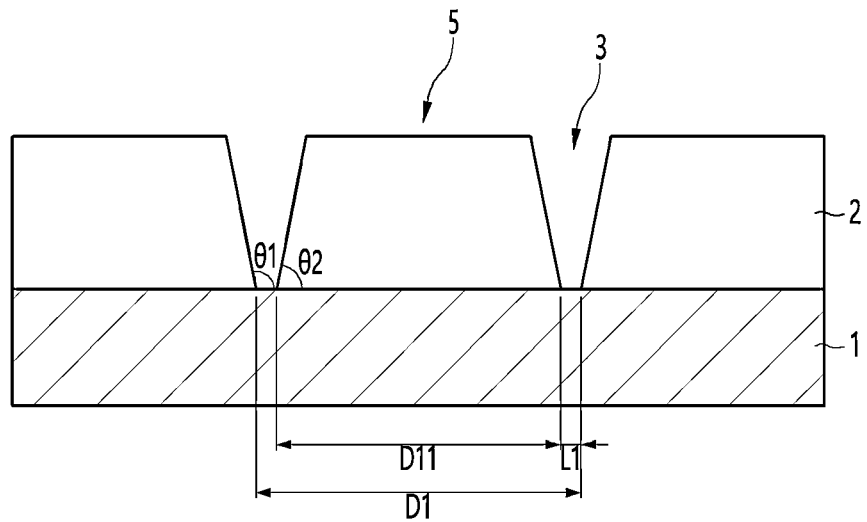
[FIG. 2]
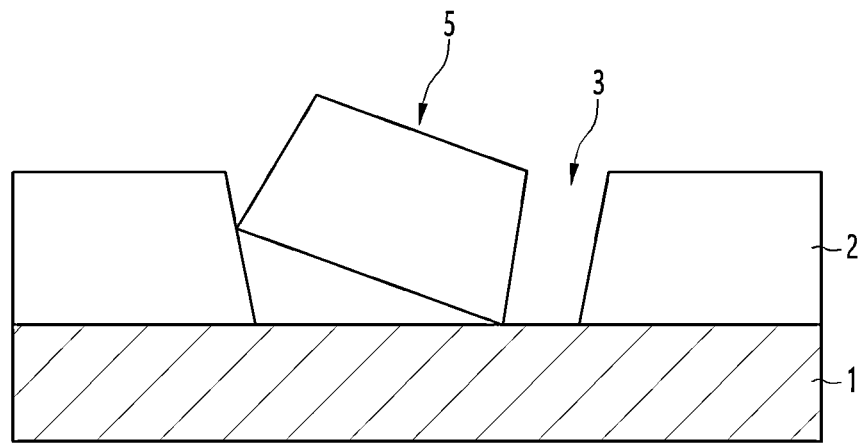

[FIG. 3]
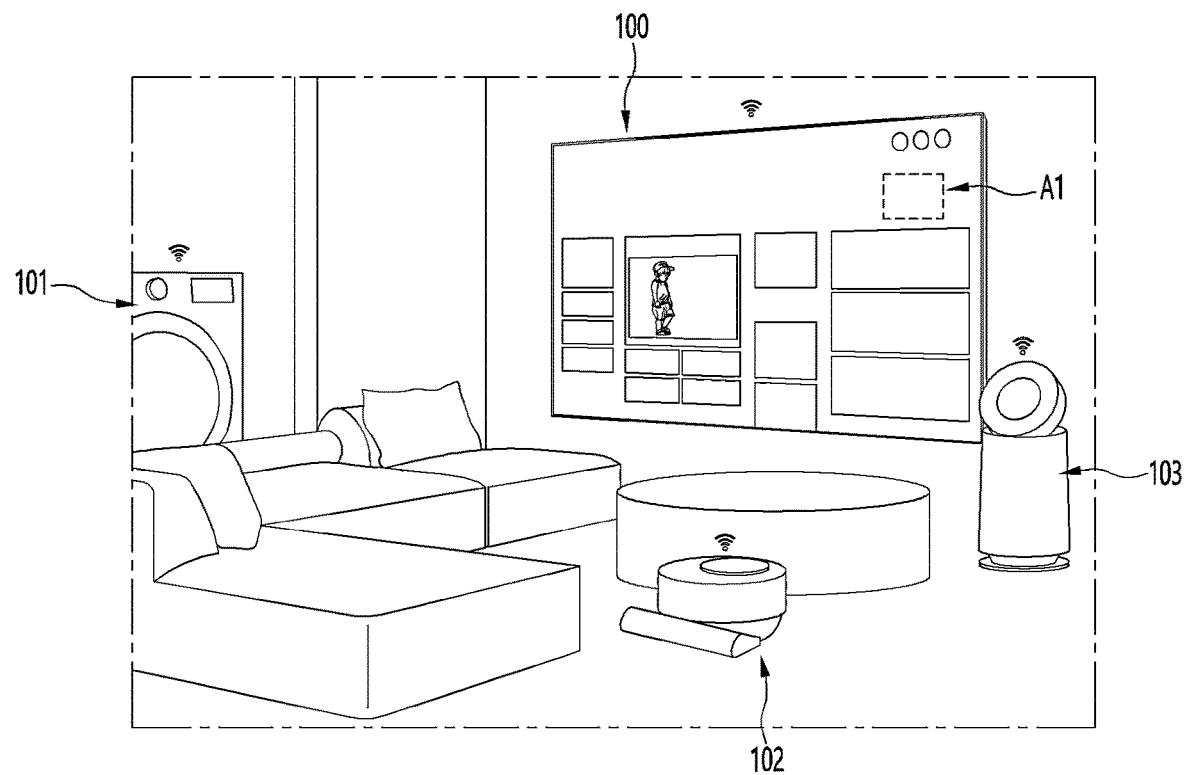

[FIG. 4]
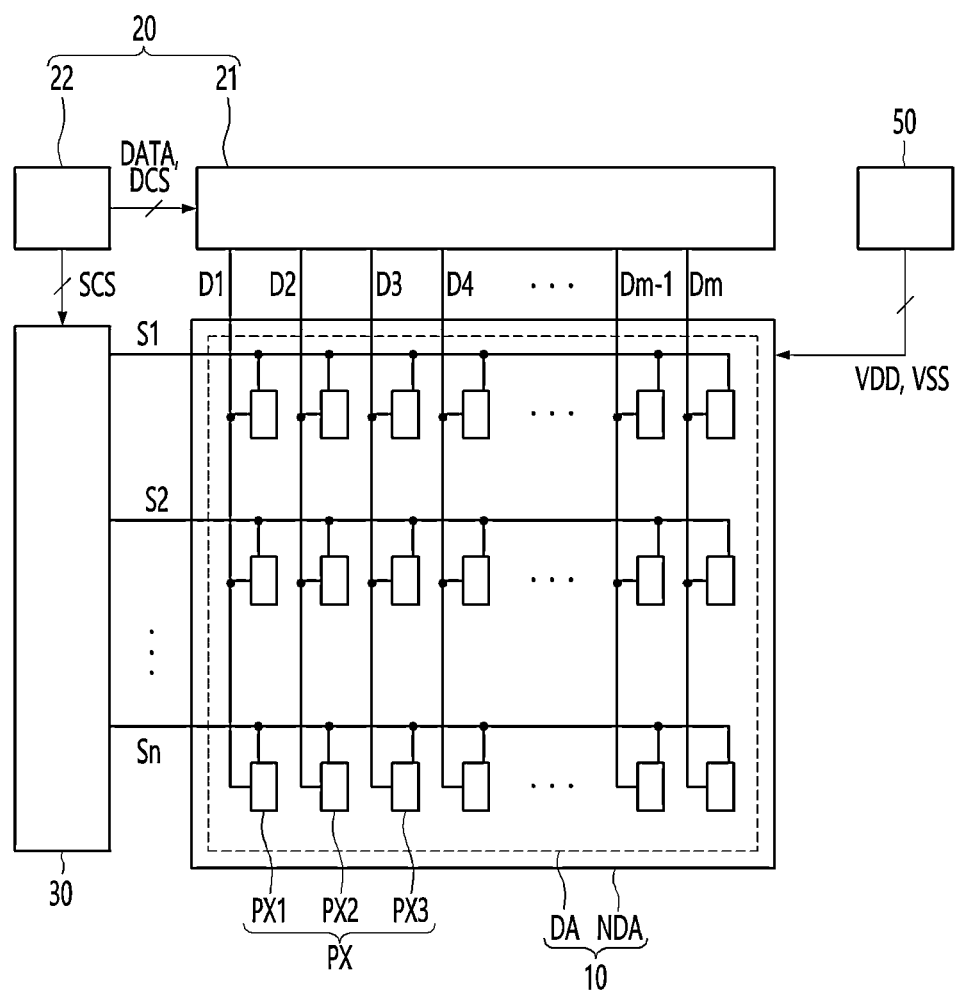

[FIG. 5]
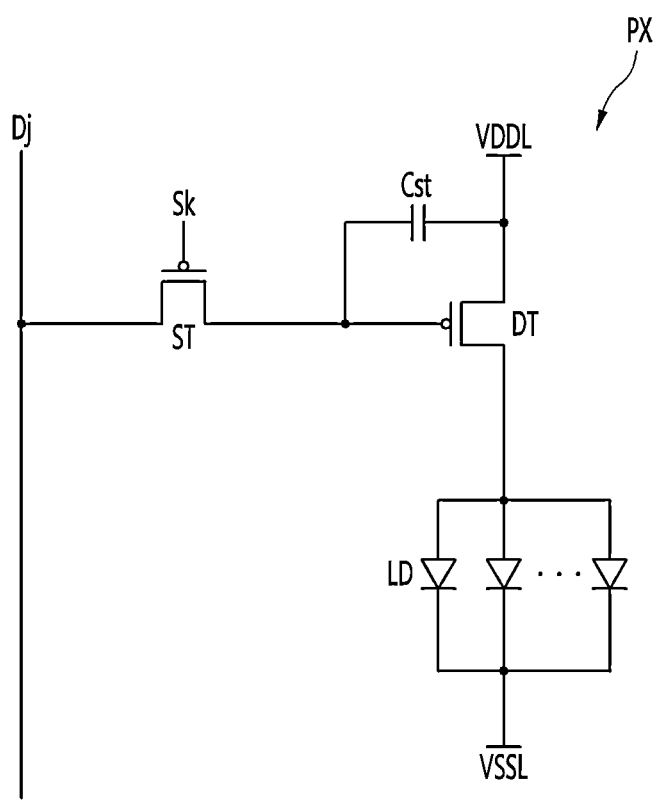

[FIG. 6]
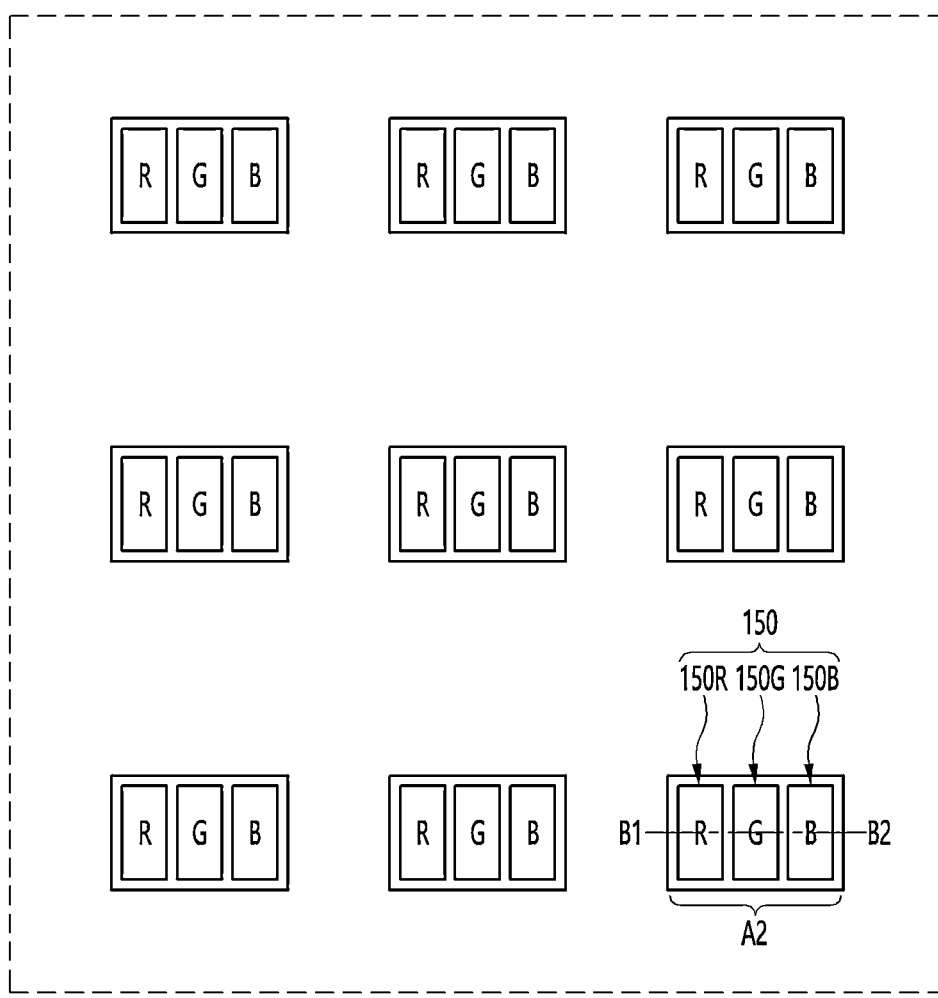

[FIG. 7]
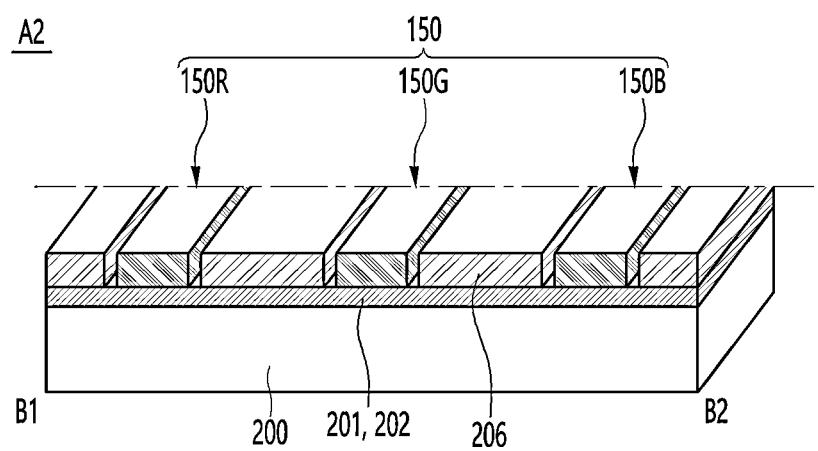
[FIG. 8]
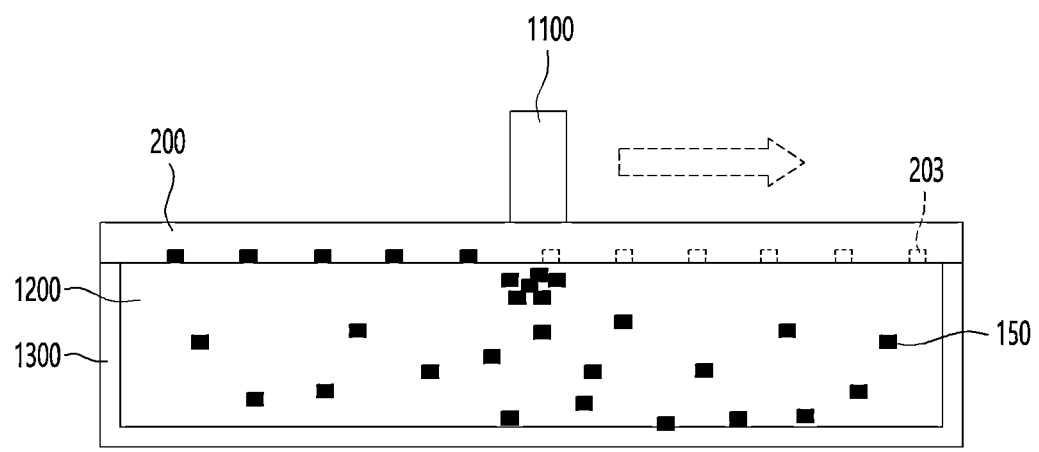

[FIG. 9]
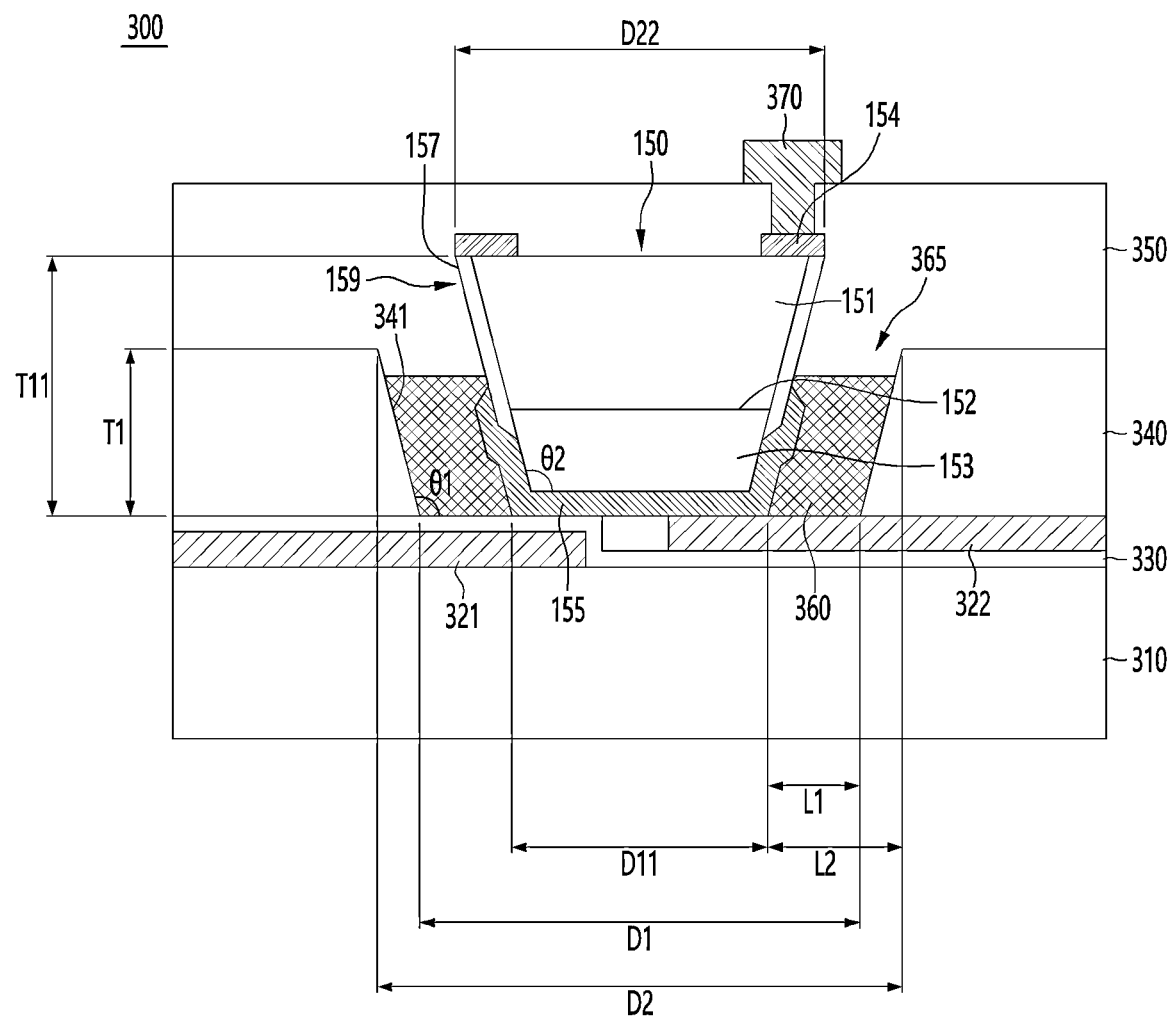

[FIG. 10]
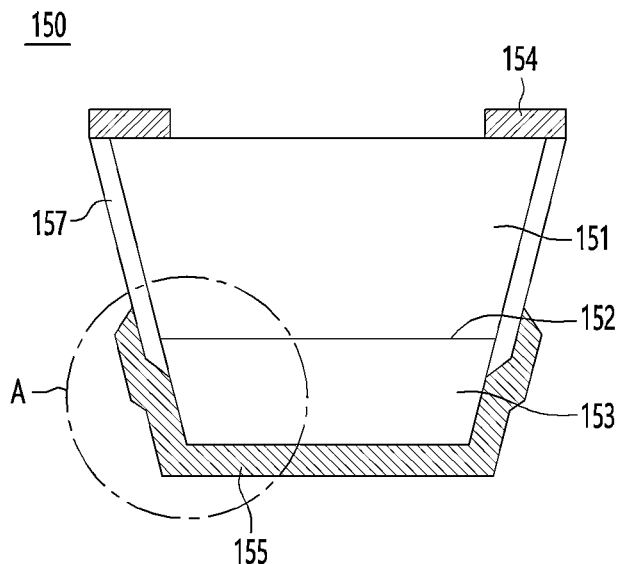
[FIG. 11]
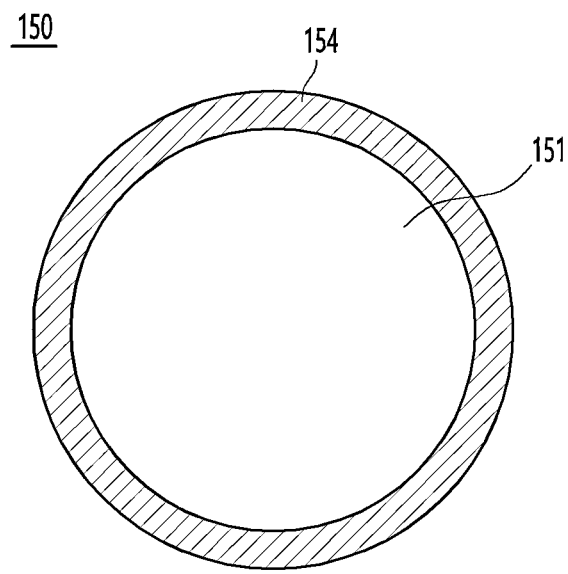

[FIG. 12]
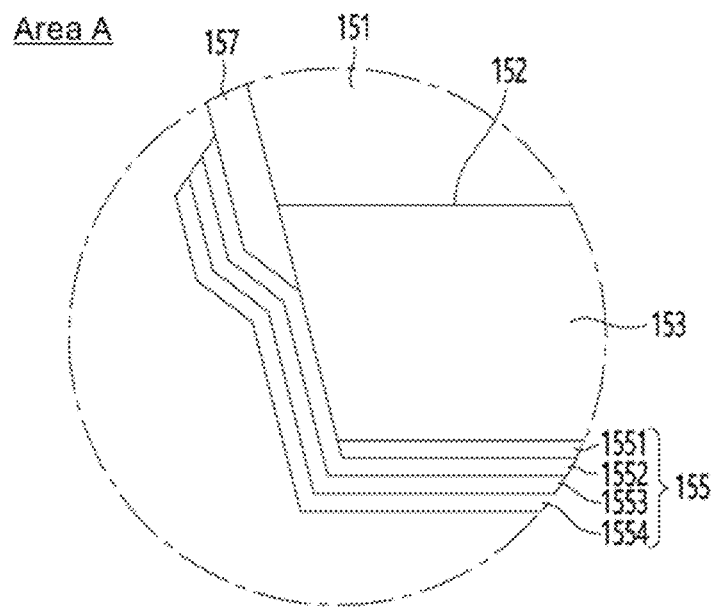
[FIG. 13]
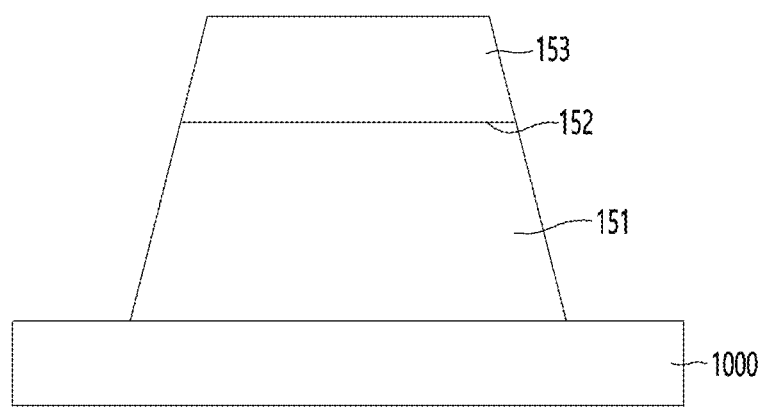

[FIG. 14]
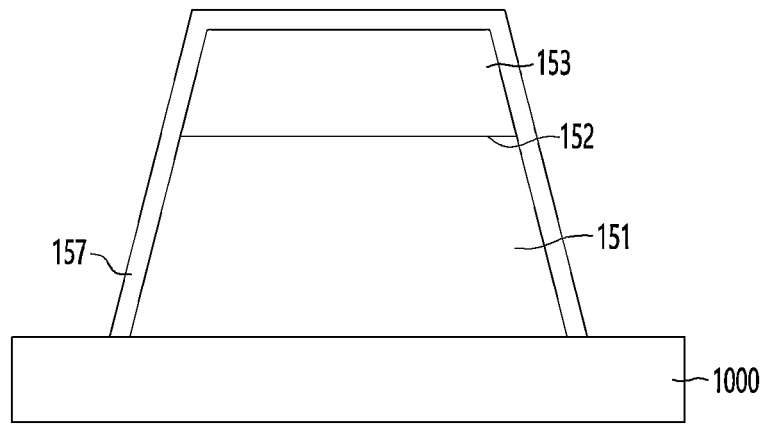
[FIG. 15]
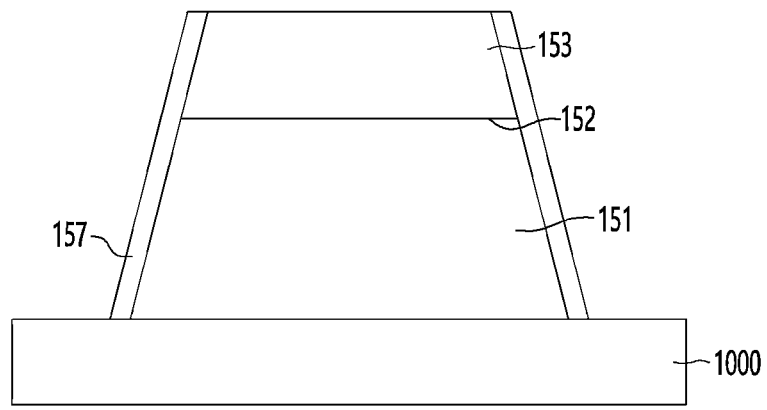
[FIG. 16]
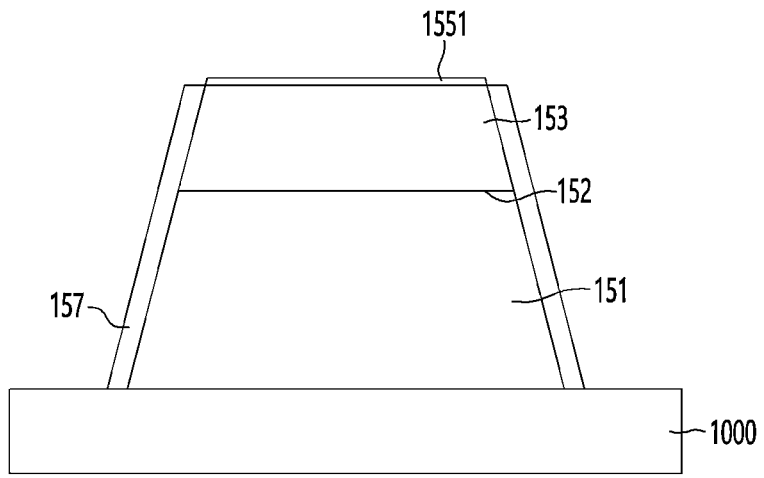

[FIG. 17]
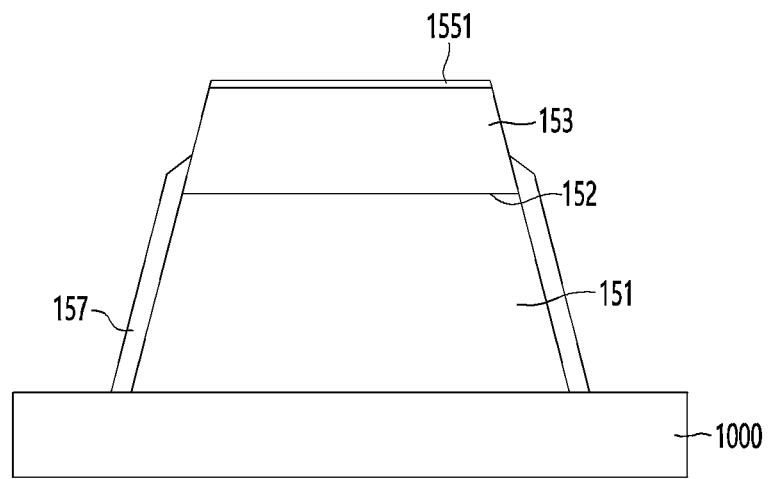
[FIG. 18]
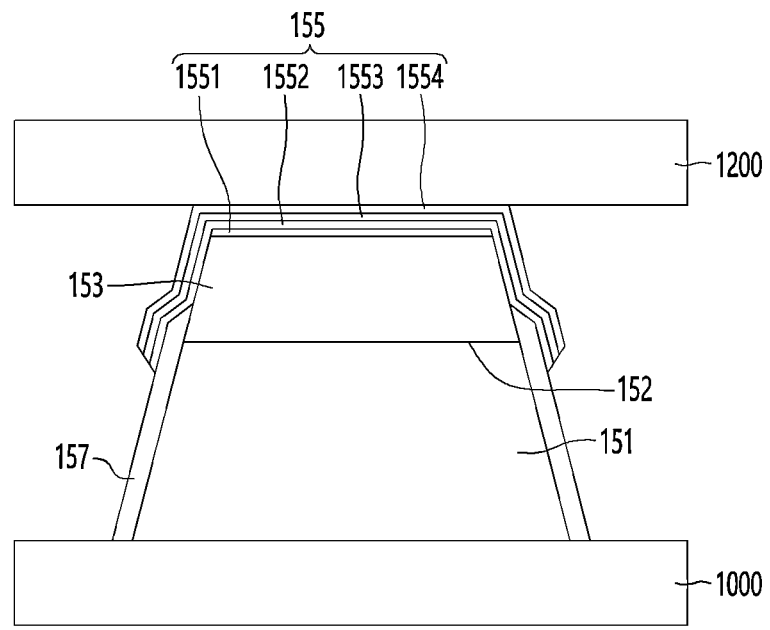

[FIG. 19]
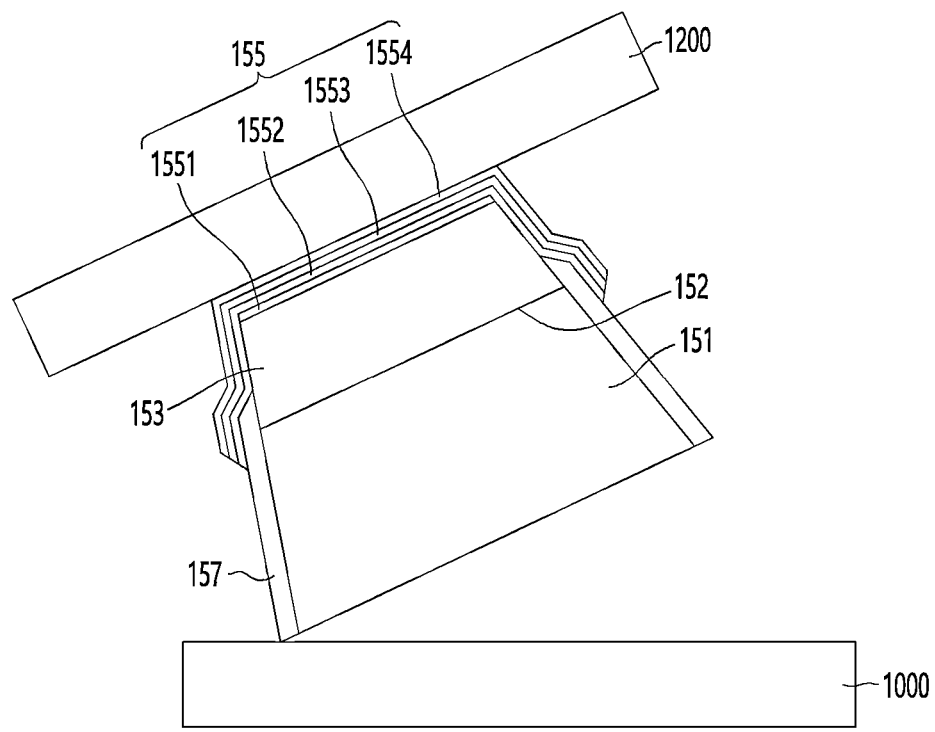
[FIG. 20]
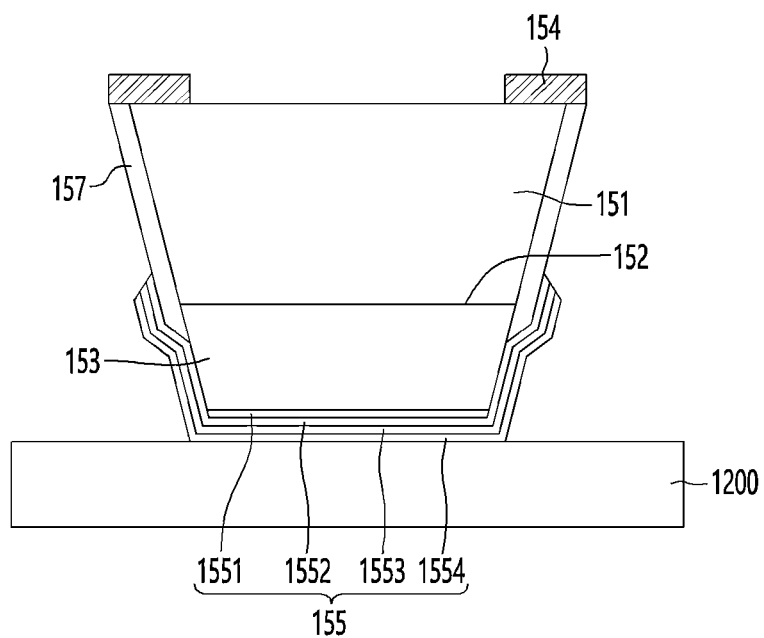

[FIG. 21]
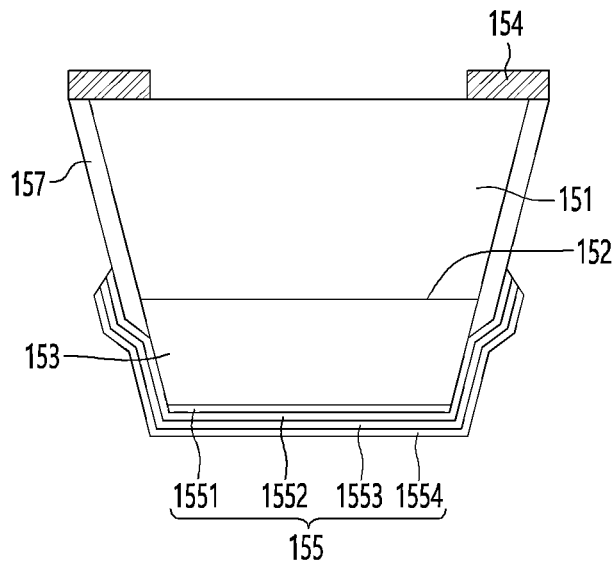
[FIG. 22]
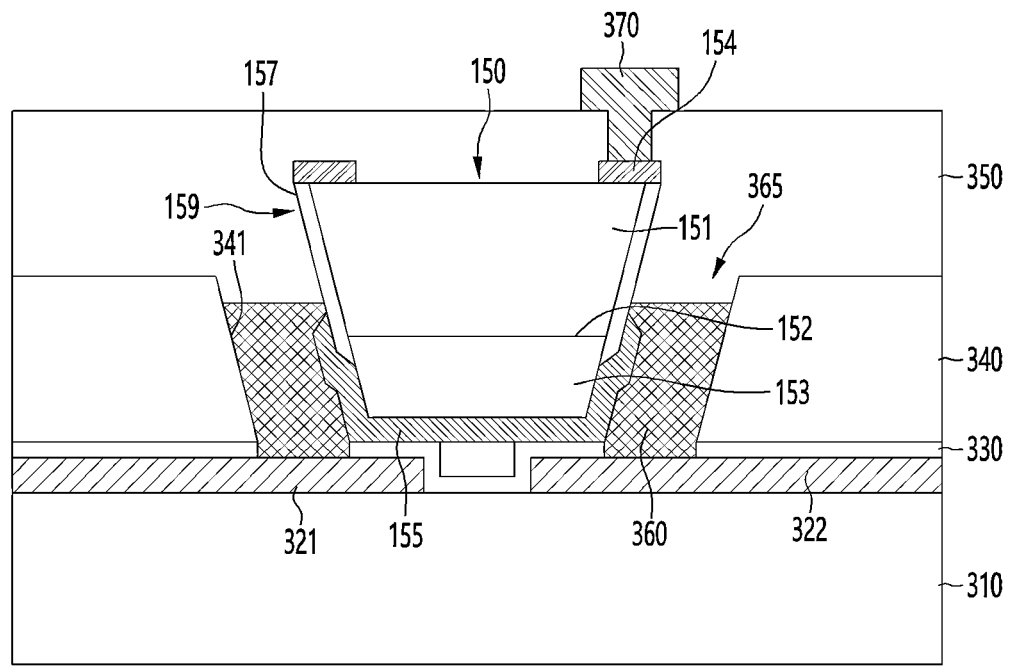

DISPLAY DEVICE

CROSS REFERENCE TO RELATED APPLICATIONS

This application is the National Phase of PCT International Application No. PCT/KR2021/016568, filed on Nov. 12, 2021, which is hereby expressly incorporated by reference into the present application.

JOINT RESEARCH AGREEMENT

The claimed invention was made by, or on behalf of, parties to a joint research agreement that was in effect on or before the effective filing date of the claimed invention. The claimed invention was made as a result of activities undertaken within the scope of the joint research agreement. The parties to the joint research agreement are LG ELECTRONICS, INC. and LG Display Co., Ltd.

TECHNICAL FIELD

The embodiment relates to a display device.

BACKGROUND ART

Display devices display high-definition images using self-luminous devices such as light emitting diodes as light sources for pixels. Light emitting diodes exhibit excellent durability even under harsh environmental conditions and are capable of long lifespan and high brightness, so they are attracting attention as a light source for next-generation display devices.

Recently, research is underway to manufacture ultra-small light emitting diodes using highly reliable inorganic crystal structure materials and place them on panels of display devices (hereinafter referred to as "display panels") to use them as next-generation light sources.

These display devices are expanding beyond flat displays into various forms such as flexible displays, foldable displays, stretchable displays, and rollable displays.

In order to realize high resolution, the size of pixels is gradually becoming smaller, and since the light emitting device must be aligned with numerous pixels of such a small size, research on the manufacture of ultra-small light emitting diodes as small as micro or nano scale is being actively conducted.

Display devices typically contain tens of millions of pixels or more. Accordingly, because it is very difficult to align at least one light-emitting device in each of tens of millions of small pixels, various studies on ways to align light-emitting devices in a display panel are being actively conducted.

As the size of light-emitting devices becomes smaller, quickly and accurately transferring these light-emitting devices onto the substrate is becoming a very important problem to solve. Transfer technologies that have been recently developed include the pick and place process, laser lift-off method, or self-assembly method. In particular, the self-assembly method of transferring a light-emitting device onto a substrate using a magnetic material (or magnet) has recently been in the spotlight.

In the self-assembly method, numerous light emitting devices are dropped into the mold containing the fluid, and as the magnetic material moves, the light emitting devices dropped into the fluid are moved to the pixels of the substrate, and the light emitting devices are aligned to each pixel. Therefore, the self-assembly method is attracting attention as a next-generation transfer method because it may quickly and accurately transfer numerous light emitting devices onto the substrate.

FIG. 1 is a cross-sectional view showing a general display device.

As shown in FIG. 1, a partition 2 including an assembly hole 3 is disposed on a substrate 1. During self-assembly, a light emitting device 5 is assembled in the assembly hole 3.

During self-assembly, the light-emitting device 5 is moved to the assembly hole 3 by a magnetic field from a magnet, and the light-emitting device 5 is assembled in the assembly hole 3 by a dielectrophoresis force.

The dielectrophoresis force is determined by the intensity of the electric field and the area of the light-emitting device 5. Therefore, the smaller the light emitting device 5, the smaller the dielectrophoresis force, so that the light emitting device 5 is not accurately assembled into the assembly hole 3, or is inserted into the assembly hole 3 with a shaky state and is then assembled tilted, or is separated after being assembled in the assembly hole 3.

As the size of light-emitting devices is decreasing in order to lower manufacturing costs and increase productivity, the above-described defects are expected to become more severe.

Meanwhile, as shown in FIG. 2, an inner side of the assembly hole 3 has an obtuse angle $\theta 1$ with respect to a lower side, while a side portion of the light emitting device 5 has an acute angle $\theta 2$ with respect to the lower side. The obtuse angle $\theta 1$ is an angle exceeding 90 degrees, and the acute angle $\theta 2$ is an angle less than 90 degrees. In this case, the difference between the diameter D11 of the light emitting device 5 and the diameter D1 of the assembly hole 3 is not large. That is, when the light emitting device 5 is assembled in the assembly hole 3, the distance L1 between the side portion of the light emitting device 5 and the inner side of the assembly hole 3 is very small. In this way, since the distance L1 between the side portion of the light emitting device 5 and the inner side of the assembly hole 3 is very small, the light emitting device 5 is not accurately assembled in the assembly hole 3 or is assembled at an angle. In this way, if the light emitting device 5 is not accurately assembled in the assembly hole 3, is assembled at an angle, or is separated, lighting defects may occur due to poor electrical connection.

In addition, a diameter D1 of the assembly hole 3 becomes smaller from an upper side to a lower side. That is, the assembly hole 3 has the shortest diameter at the lower side. On the other hand, a diameter D11 of the light emitting device 5 increases from the upper side to the lower side. That is, the light emitting device 5 has the longest diameter at the lower side. In this case, the lower diameter of the assembly hole 3 is made larger than the lower diameter of the light emitting element 5, when the light emitting device 5 is assembled in the assembly hole 3, a separation margin is ensured between the lower side portion of the light emitting device 5 and the lower inner side of the assembly hole 3. In order to increase the separation margin, the diameter of the lower side of the assembly hole 3 must be increased. As the diameter of the lower side of the assembly hole 3 increases, the diameter of the upper side of the assembly hole 3 also increases. However, there is a limit to increasing the diameter of the lower and upper sides of the assembly hole 3 due to size limitations between each sub-pixel of the pixel.

On the other hand, if the separation margin is large, it becomes more difficult to assemble the light-emitting device 5 in the correct position in the assembly hole 3, and the possibility of the light-emitting device 5 coming off increases, making it difficult to increase the separation margin.

DISCLOSURE

Technical Problem

The embodiment objects to solve the above-mentioned problems and other problems.

Another object of the embodiment is to provide a display device that can prevent assembly defects.

Another object of the embodiment is to provide a display device having a light emitting device of micro level or less.

Another object of the embodiment is to provide a display device with high resolution or high definition.

The technical objects of the embodiments are not limited to those described in this item and include those that can be understood through the description of the invention.

Technical Solution

According to one aspect of the embodiment to achieve the above or other purposes, the display device, a substrate, a first and second assembly wirings on the substrate, a partition having a hole on the first and second assembly wirings, and a semiconductor light emitting device in the hole, wherein the hole configured to have an inner side with a first obtuse angle to a lower side, and wherein the semiconductor light emitting device configured to have at least one side having a second obtuse angle with respect to the lower side.

The second obtuse angle may be the same as the first obtuse angle.

The second obtuse angle is different from the first obtuse angle, and the difference between the first obtuse angle and the second obtuse angle may be less than 90°.

The semiconductor light emitting device includes a light emitting part, a first electrode on the light emitting part, a second electrode below the light emitting part, and a passivation layer on a perimeter of the side portion of the light emitting part, and wherein the second electrode may be disposed a perimeter of the side portion of the light emitting part.

The second electrode may be disposed on the passivation layer.

The second electrode may include a conductive layer.

The second electrode includes a reflective layer, and the reflective layer may be disposed on the perimeter of the side portion of the light emitting part The second electrode includes a magnetic layer, and the magnetic layer may be disposed on the perimeter of the side portion of the light emitting part The second electrode includes an electrode layer, and the electrode layer may be disposed on the perimeter of the side portion of the light emitting part The first electrode may be placed on one side of an upper surface of the light emitting part.

A diameter of the lower side portion of the semiconductor light emitting device may be 30% to 80% of the diameter of the lower side of the hole.

A side portion of the semiconductor light emitting device may be parallel to the inner side of the hole.

A connection portion in contact with the second electrode may be included along the perimeter of the side portion of the semiconductor light emitting device within the hole.

The first and second assembly wirings are disposed on different layers, and the connection portion may be connected to at least one assembly wiring of the first and second assembly wirings.

Embodiment may include a first insulating layer on the first and second assembly wiring, the first and second assembly wirings are disposed on the same layer, and the connection portion may be connected to at least one assembly wiring of the first and second assembly wirings through the first insulating layer.

Embodiment may include a second insulating layer on the partition and the semiconductor light emitting device and an electrode wiring in contact with the first electrode through the second insulating layer.

A thickness of the partition may be smaller than a thickness of the semiconductor light emitting device.

The semiconductor light emitting device may include a vertical type semiconductor light emitting device.

Advantageous Effects

According to the embodiment, as shown in FIG. 9, the inner side 341 of the hole 365 has a first obtuse angle θ1 with respect to the lower side, and at least one side portion 159 of the semiconductor light emitting device 150 may have a second obtuse angle θ2 with respect to the lower side. Since the inner side 341 of the hole 365 and the side portion 159 of the semiconductor light emitting device 150 have obtuse angles θ1 and θ2 exceeding 90 degrees, the separation margin between the side portion 159 of the semiconductor light emitting device 150 and the inner side 341 of the hole 365 is large, so that the semiconductor light emitting device 150 can be safely assembled in the hole 365 without being tilted.

In general, when the size of the semiconductor light emitting device 150 is reduced to micro level or less, the dielectrophoresis force is also reduced, which may cause assembly defects. Nevertheless, in the embodiment, the shape of the semiconductor light emitting device 150 is made to correspond to the shape of the hole 365 of the partition 340, so during self-assembly, lighting defects can be prevented by preventing assembly defects such as tilting of the semiconductor light emitting device 150. When arranging a general light emitting device (5 in FIGS. 1 and 2), if the light emitting device 5 is assembled at an angle within the assembly hole 3, an electrical connection failure occurs, resulting in a lighting defect. In addition, when the dielectrophoresis force of the semiconductor light emitting device 150 assembled in the hole 365 is small, it is separated to the outside, and lighting defects occur due to the separation of the semiconductor light emitting device 150. According to the first embodiment, by considering the shape of the hole 365 having the inner side 341 of the first obtuse angle θ1, the side portion 159 of the semiconductor light emitting device 150 also has a second obtuse angle θ2, so the larger separation margin can be secured between the side portion 159 of the semiconductor light emitting device and the inner side of the hole, and during self-assembly, tilting of the semiconductor light emitting device can be prevented, thereby preventing lighting assembly defects. By preventing assembly defects, lighting defects can also be prevented.

According to the embodiment, despite the size of the semiconductor light emitting device 150 being reduced, the magnetic layer 1553 of the second electrode 155 is placed not only on the lower side but also on the side portion 159 of the semiconductor light emitting device 150 to maximize the area of the magnetic layer 1553, so the magnetization intensity of the semiconductor light emitting device 150 is increasing, when assembling, the magnetization of the semiconductor light emitting device 150 is increased by the magnet, so that the semiconductor light emitting device 150 can be easily moved to the corresponding hole 365 of the substrate 310 and the assembly rate can be improved.

According to the embodiment, since the second electrode 155 is placed on the side portion 159 of the semiconductor light emitting device 150 and is electrically connected to the first assembly wiring 321 and/or the second assembly wiring 322 through the connection portion 360 disposed along the perimeter of the side 159 of the semiconductor light emitting device 150, electrical connection is easy and electrical disconnection defects can be prevented.

According to the embodiment, the size of the semiconductor light emitting device 150 can be reduced while preventing assembly defects, making it possible to implement a display with high resolution or high definition.

Additional scope of applicability of the embodiments will become apparent from the detailed description below. However, since various changes and modifications within the spirit and scope of the embodiments may be clearly understood by those skilled in the art, the detailed description and specific embodiments, such as preferred embodiments, should be understood as being given by way of example only.

DESCRIPTION OF DRAWINGS

FIG. 1 is a cross-sectional view showing a general display device.

FIG. 2 is a diagram showing assembly defects.

FIG. 3 shows the living room of a house where a display device according to an embodiment is placed.

FIG. 4 is a block diagram schematically showing a display device according to an embodiment.

FIG. 5 is a circuit diagram showing an example of the pixel of FIG. 4.

FIG. 6 is an enlarged view of the first panel area in the display device of FIG. 3.

FIG. 7 is an enlarged view of area A2 in FIG. 6.

FIG. 8 is a diagram showing an example in which a light emitting device according to an embodiment is assembled on a substrate by a self-assembly method.

FIG. 9 is a cross-sectional view showing a display device according to the first embodiment.

FIG. 10 is a cross-sectional view showing the semiconductor light emitting device of FIG. 9.

FIG. 11 is a plan view showing the semiconductor light emitting device of FIG. 9.

FIG. 12 is an enlarged view showing area A of FIG. 10.

FIGS. 13 to 21 show a method of manufacturing a semiconductor light emitting device of an embodiment.

FIG. 22 is a cross-sectional view showing a display device according to the second embodiment.

The size, shape, and dimensions of the components shown in the drawings may be different from the actual ones. In addition, although the same components are shown in different sizes, shapes, and numbers between the drawings, this is only an example in the drawings, and same components may have the same size, shape, and numerical value between drawings.

MODE FOR INVENTION

Hereinafter, embodiments disclosed in the present specification will be described in detail with reference to the attached drawings, but identical or similar components will be assigned the same reference numbers regardless of the reference numerals, and duplicate descriptions thereof will be omitted. The suffixes 'module' and 'part' for components used in the following description are given or used interchangeably in consideration of ease of specification preparation, and do not have distinct meanings or roles in themselves. Additionally, the attached drawings are intended to facilitate easy understanding of the embodiments disclosed in this specification, and the technical idea disclosed in this specification is not limited by the attached drawings. Additionally, when an element such as a layer, region or substrate is referred to as being 'on' another component, this includes either directly on the other element or there may be other intermediate elements in between.

Display devices described in this specification may be included TVs, shines, mobile phones, smart phones, head-up displays (HUDs) for automobiles, backlight units for laptop computers, and displays for VR or AR. etc. However, the configuration according to the embodiment described in this specification may be applied to a device capable of displaying even if it is a new product type that is developed in the future.

Hereinafter, a light emitting device and a display device including the same according to an embodiment will be described.

FIG. 3 shows a living room of a house where a display device according to an embodiment is placed.

Referring to FIG. 3, the display device 100 of the embodiment may display the status of various electronic products such as a washing machine 101, a robot vacuum cleaner 102, and an air purifier 103 and it is possible to communicate with each electronic product based on IOT and control each electronic product based on the user's setting data.

The display device 100 according to the embodiment may include a flexible display manufactured on a thin and flexible substrate. Flexible displays may bend or curl like paper while maintaining the characteristics of existing flat displays.

In a flexible display, visual information may be implemented by independently controlling the emission of unit pixels arranged in a matrix form. A unit pixel refers to the minimum unit for implementing one color. A unit pixel of a flexible display may be implemented by a light emitting device. In the embodiment, the light emitting device may be Micro-LED or Nano-LED, but is not limited thereto.

FIG. 4 is a block diagram schematically showing a display device according to an embodiment, and FIG. 5 is a circuit diagram showing an example of the pixel of FIG. 4.

Referring to FIGS. 4 and 5, a display device according to an embodiment may include a display panel 10, a driving circuit 20, a scan driver 30, and a power supply circuit 50.

The display device 100 of the embodiment may drive a light emitting device in an active matrix (AM, Active Matrix) method or a passive matrix (PM, Passive Matrix) method.

The driving circuit 20 may include a data driving unit 21 and a timing control unit 22.

The display panel 10 may be rectangular, but there is no limitation thereto. That is, the display panel 10 may be formed in a circular or oval shape. At least one side of the display panel 10 may be bent to a predetermined curvature.

The display panel 10 may be divided into a display area DA and a non-display area NDA disposed around the display area DA. The display area DA is an area where pixels PX are formed to display an image. The display panel 10 may include a data lines (D1 to Dm, m is an integer greater than 2), scan lines (S1 to Sn, n is an integer of 2 or more) that intersect with the data lines (D1 to Dm), a high-potential voltage line VDDL supplied with high-potential voltage, a low-potential voltage line VSSL supplied with low-potential voltage, and a pixels PX connected to the data lines (D1 to Dm) and the scan lines (S1 to Sn).

Each of the pixels PX may include a first sub-pixel PX1, a second sub-pixel PX2, and a third sub-pixel PX3. The first sub-pixel PX1 may emit a first color light of a first main wavelength, the second sub-pixel PX2 may emit a second color light of a second main wavelength, and the third sub-pixel PX3 may emit third color light of the third main wavelength. The first color light may be red light, the second color light may be green light, and the third color light may be blue light, but are not limited thereto. Additionally, in FIG. 4, it is illustrated that each pixel PX includes three sub-pixels, but the present invention is not limited thereto. That is, each pixel PX may include four or more sub-pixels.

Each of the first sub-pixel PX1, the second sub-pixel PX2, and the third sub-pixel PX3 may be connected at least one of the data lines (D1 to Dm), at least one of the scan lines (S1 to Sn) and the high-potential voltage line VDDL. As shown in FIG. 5, the first sub-pixel PX1 may include light emitting devices LD, a plurality of transistors for supplying current to the light emitting devices LD, and at least one capacitor Cst.

Although not shown in the drawing, each of the first sub-pixel PX1, the second sub-pixel PX2, and the third sub-pixel PX3 may include only one light emitting device LD and at least one capacitor Cst.

Each of the light emitting devices LD may be a semiconductor light emitting diode including a first electrode, a plurality of conductive semiconductor layers, and a second electrode. Here, the first electrode may be an anode electrode and the second electrode may be a cathode electrode, but this is not limited.

The light emitting device LD may be one of a horizontal light emitting device, a flip chip type light emitting device, and a vertical type light emitting device.

The plurality of transistors, as shown in FIG. 5, may include a driving transistor DT that supplies current to the light emitting devices LD, and a scan transistor ST that supplies a data voltage to the gate electrode of the driving transistor DT.

The driving transistor DT may include a gate electrode connected to the source electrode of the scan transistor ST, a source electrode connected to a high-potential voltage line VDDL to which a high-potential voltage is applied, and a drain electrode connected to the first electrodes of light emitting devices LD. The scan transistor ST may include a gate electrode connected to the scan line (Sk, k is an integer satisfying 1≤k≤n), a source electrode connected to the gate electrode of the driving transistor DT and a drain electrode connected to the data line (Dj, j is an integer satisfying 1≤j≤m).

The capacitor Cst is formed between the gate electrode and the source electrode of the driving transistor DT. The storage capacitor Cst charges the difference value between the gate voltage and source voltage of the driving transistor DT.

The driving transistor DT and the scan transistor ST may be formed of a thin film transistor. In addition, in FIG. 5, the driving transistor DT and the scan transistor ST are mainly described as being formed of a P-type MOSFET (Metal Oxide Semiconductor Field Effect Transistor), but the present invention is not limited thereto. The driving transistor DT and scan transistor ST may be formed of an N-type MOSFET. In this case, the positions of the source and drain electrodes of the driving transistor DT and the scan transistor ST may be changed.

In addition, in FIG. 5, although the first sub-pixel PX1, the second sub-pixel PX2, and the third sub-pixel PX3 each include 2T1C (2 Transistor—1 capacitor) with one driving transistor DT, one scan transistor ST and one capacitor Cst, but the present invention is not limited to this. Each of the first sub-pixel PX1, the second sub-pixel PX2, and the third sub-pixel PX3 may include a plurality of scan transistors ST and a plurality of capacitors Cst.

Since the second sub-pixel PX2 and the third sub-pixel PX3 may be represented by substantially the same circuit diagram as the first sub-pixel PX1, detailed descriptions thereof will be omitted.

The driving circuit 20 outputs signals and voltages to drive the display panel 10. For this purpose, the driving circuit 20 may include a data driving unit 21 and a timing control unit 22.

The data driving unit 21 receives digital video data DATA and source control signal DCS from the timing control unit 22. The data driving unit 21 converts digital video data DATA into analog data voltages according to the source control signal DCS and supplies them to the data lines (D1 to Dm) of the display panel 10.

The timing control unit 22 receives digital video data DATA and timing signals from the host system. Timing signals may include a vertical sync signal, a horizontal sync signal, a data enable signal, and a dot clock. The host system may be an application processor in a smartphone or tablet PC, a monitor, or a system-on-chip in a TV.

The timing control unit 22 generates control signals to control the operation timing of the data driving unit 21 and the scan driver 30. Control signals may include a source control signal DCS for controlling the operation timing of the data driving unit 21 and a scan control signal SCS for controlling the operation timing of the scan driver 30.

The driving circuit 20 may be arranged in a non-display area NDA provided on one side of the display panel 10. The driving circuit 20 may be formed of an integrated circuit (IC) and mounted on the display panel 10 using a COG (chip on glass) method, a COP (chip on plastic) method, or an ultrasonic bonding method, but the present invention is not limited to this. For example, the driving circuit 20 may be mounted on a circuit board (not shown) rather than on the display panel 10.

The data driving unit 21 is mounted on the display panel 10 using a COG (chip on glass) method, a COP (chip on plastic) method, or an ultrasonic bonding method, and the timing control unit 22 may be mounted on a circuit board.

The scan driver 30 receives a scan control signal SCS from the timing control unit 22. The scan driver 30 generates scan signals according to the scan control signal SCS and supplies them to the scan lines (S1 to Sn) of the display panel 10. The scan driver 30 may include a plurality of transistors and be formed in the non-display area NDA of the display panel 10. Alternatively, the scan driver 30 may be formed as an integrated circuit, and in this case, it may be mounted on a gate flexible film attached to the other side of the display panel 10.

The circuit board may be attached to pads provided at one edge of the display panel 10 using an anisotropic conductive film. Because of this, the lead lines of the circuit board can be electrically connected to the pads. The circuit board may be a flexible printed circuit board, a printed circuit board, or a flexible film such as a chip on film. The circuit board may be bent toward the bottom of the display panel 10. Because of this, one side of the circuit board is attached to one edge of the display panel 10, and the other side is placed below the display panel 10 and can be connected to a system board on which the host system is mounted.

The power supply circuit 50 may generate voltages necessary for driving the display panel 10 from the main power supplied from the system board and supply them to the display panel 10. For example, the power supply circuit 50 generates a high potential voltage VDD and a low potential voltage VSS to drive the light emitting devices LD of the display panel 10 from the main power supply, and it may be supplied to the high potential voltage line VDDL and the low potential voltage line VSSL of the display panel 10. Additionally, the power supply circuit 50 may generate and supply driving voltages for driving the driving circuit 20 and the scan driver 30 from the main power supply.

FIG. 6 is an enlarged view of the first panel area in the display device of FIG. 3.

Referring to FIG. 6, the display device 100 of the embodiment may be manufactured by mechanically and electrically connecting a plurality of panel areas, such as the first panel area A1, by tiling.

The first panel area A1 may include a plurality of semiconductor light emitting devices 150 arranged for each unit pixel (PX in FIG. 4).

For example, the unit pixel PX may include a first sub-pixel PX1, a second sub-pixel PX2, and a third sub-pixel PX3. For example, a plurality of red semiconductor light emitting devices 150R may be disposed in the first sub-pixel PX1, a plurality of green semiconductor light emitting devices 150G may be disposed in the second sub-pixel PX2, and a plurality of blue semiconductor light emitting devices 150B may be disposed in the third sub-pixel PX3. The unit pixel PX may further include a fourth sub-pixel in which a semiconductor light emitting device is not disposed, but this is not limited.

FIG. 7 is an enlarged view of area A2 in FIG. 6.

Referring to FIG. 7, the display device 100 of the embodiment may include a substrate 200, an assembly wiring 201 and 202, an insulating layer 206, and a plurality of semiconductor light emitting devices 150. More components may be included than this.

The assembly wiring may include first assembly wiring 201 and second assembly wiring 202 spaced apart from each other. The first assembly wiring 201 and the second assembly wiring 202 may be provided to generate dielectrophoresis force to assemble the semiconductor light emitting device 150. For example, the semiconductor light emitting device 150 may be one of a horizontal semiconductor light emitting device, a flip chip type semiconductor light emitting device, and a vertical type semiconductor light emitting device.

The semiconductor light emitting device 150 may include a red semiconductor light emitting device 150, a green semiconductor light emitting device 150G, and a blue semiconductor light emitting device 150B0 to form a unit pixel (sub-pixel), but is not limited to this, and it is also possible to implement red and green colors by using red phosphors and green phosphors, respectively.

The substrate 200 may be a support member that supports components placed on the substrate 200 or a protection member that protects the components.

The substrate 200 may be a rigid substrate or a flexible substrate. The substrate 200 may be formed of sapphire, glass, silicon, or polyimide. Additionally, the substrate 200 may include a flexible material such as PEN (Polyethylene Naphthalate) or PET (Polyethylene Terephthalate). Additionally, the substrate 200 may be a transparent material, but is not limited thereto.

The substrate 200 may be a backplane equipped with circuits in the sub-pixels (PX1, PX2, PX3) shown in FIGS. 4 and 5, such as transistors (ST, DT), capacitors Cst, signal wires, etc., but there is no limitation to this.

The insulating layer 206 may include an insulating and flexible organic material such as polyimide, PAC, PEN, PET, polymer, etc., or an inorganic material such as silicon oxide (SiO2) or silicon nitride series (SiNx), and it may be integrated with the substrate 200 to form one substrate.

The insulating layer 206 may be a conductive adhesive layer that has adhesiveness and conductivity, and the conductive adhesive layer may be flexible and enable a flexible function of the display device. For example, the insulating layer 206 may be an anisotropic conductive film (ACF) or a conductive adhesive layer such as an anisotropic conductive medium or a solution containing conductive particles. The conductive adhesive layer may be a layer that is electrically conductive in a direction perpendicular to the thickness, but electrically insulating in a direction horizontal to the thickness.

The insulating layer 206 may include an assembly hole 203 into which the semiconductor light emitting device 150 is inserted. Therefore, during self-assembly, the semiconductor light emitting device 150 may be easily inserted into the assembly hole 203 of the insulating layer 206. The assembly hole 203 may be called an insertion hole, fixing hole, alignment hole, etc.

The assembly hole (203) may be called a hole, groove, recess, pocket, etc.

The assembly hole 203 may be different depending on the shape of the semiconductor light emitting device 150. For example, the red semiconductor light emitting device, the green semiconductor light emitting device, and the blue semiconductor light emitting device each have different shapes, and may have an assembly hole 203 having a shape corresponding to the shape of each semiconductor light emitting device. For example, the assembly hole 203 may include a first assembly hole for assembling a red semiconductor light emitting device, a second assembly hole for assembling a green semiconductor light emitting device, and a third assembly hole for assembling a blue semiconductor light emitting device. For example, the red semiconductor light emitting device has a circular shape, the green semiconductor light emitting device has a first oval shape with a first minor axis and a second major axis, the blue semiconductor light emitting device may have a second oval shape with a second minor axis and a second major axis, but there is no limitation to this. The second major axis of the oval shape of the blue semiconductor light emitting device may be larger than the second major axis of the oval shape of the green semiconductor light emitting device, and the second minor axis of the oval shape of the blue semiconductor light emitting device may be smaller than the first minor axis of the oval shape of the green semiconductor light emitting device.

Meanwhile, methods of mounting the semiconductor light emitting device 150 on the substrate 200 may include, for example, a self-assembly method (FIG. 8) and a transfer method.

FIG. 8 is a diagram showing an example in which a semiconductor light emitting device according to an embodiment is assembled on a substrate by a self-assembly method.

The self-assembly method of the semiconductor light emitting device will be described with reference to FIGS. 7 and 8.

The substrate 200 may be a panel substrate of a display device. In the following description, the substrate 200 will be described as a panel substrate of a display device, but the embodiment is not limited thereto.

The substrate 200 may be formed of glass or polyimide. Additionally, the substrate 200 may include a flexible material such as PEN (Polyethylene Naphthalate) or PET (Polyethylene Terephthalate). Additionally, the substrate 200 may be a transparent material, but is not limited thereto.

Referring to FIG. 8, the semiconductor light emitting device 150 may be inserted into the chamber 1300 filled with the fluid 1200. The fluid 1200 may be water such as ultrapure water, but is not limited thereto. The chamber may be called a water tank, container, vessel, etc.

After this, the substrate 200 may be placed on the chamber 1300. Depending on the embodiment, the substrate 200 may be introduced into the chamber 1300.

As shown in FIG. 7, a pair of assembly wirings 201 and 202 corresponding to each semiconductor light emitting device 150 to be assembled may be disposed on the substrate 200.

The assembly wiring 201, 202 may be formed of a transparent electrode (ITO) or may include a metal material with excellent electrical conductivity. For example, assembly wiring 201, 202 may be formed of at least one of titanium (Ti), chromium (Cr), nickel (Ni), aluminum (Al), platinum (Pt), gold (Au), tungsten (W), or molybdenum (Mo) or an alloy thereof.

An electric field is formed in the assembly wiring 201, 202 by an externally supplied voltage, and a dielectrophoresis force may be formed between the assembly wiring 201, 202 by this electric field. The semiconductor light emitting device 150 may be fixed to the assembly hole 203 on the substrate 200 by this dielectrophoresis force.

The gap between the assembly wirings 201, 202 are formed to be smaller than the width of the semiconductor light emitting device 150 and the width of the assembly hole 203, so that the assembly position of the semiconductor light emitting device 150 using an electric field may be fixed more precisely.

An insulating layer 206 is formed on the assembly wiring 201, 202 to protect the assembly wiring 201, 202 from the fluid 1200 and may prevent leakage of current flowing in the assembly wiring 201, 202. The insulating layer 206 may be formed as a single layer or multilayer of an inorganic insulator such as silica or alumina or an organic insulator.

Additionally, the insulating layer 206 may include an insulating and flexible material such as polyimide, PEN, PET, etc., and may be integrated with the substrate 200 to form one substrate.

The insulating layer 206 may be an adhesive insulating layer or a conductive adhesive layer with conductivity. The insulating layer 206 is flexible and may enable flexible functions of the display device.

The insulating layer 206 has a partition, and an assembly hole 203 may be formed by this partition. For example, when forming the substrate 200, a portion of the insulating layer 206 is removed, so that each of the semiconductor light emitting devices 150 may be assembled into the assembly hole 203 of the insulating layer 206.

The assembly hole 203 is formed in the substrate 200 to which the light emitting devices 150 are coupled, and the surface where the assembly hole 203 is formed may be in contact with the fluid 1200. The assembly hole 203 may guide the exact assembly position of the semiconductor light emitting device 150.

Meanwhile, the assembly hole 203 may have a shape and size corresponding to the shape of the semiconductor light emitting device 150 to be assembled at the corresponding location. Accordingly, it is possible to prevent another semiconductor light emitting device from being assembled or a plurality of semiconductor light emitting devices from being assembled into the assembly hole 203.

Referring again to FIG. 8, after the substrate 200 is disposed, the assembly device 1100 including a magnetic material may move along the substrate 200. For example, a magnet or electromagnet may be used as a magnetic material. The assembly device 1100 may move while in contact with the substrate 200 in order to maximize the area to which the magnetic field is applied within the fluid 1200. Depending on the embodiment, the assembly device 1100 may include a plurality of magnetic materials or a magnetic material of a size corresponding to that of the substrate 200. In this case, the moving distance of the assembly device 1100 may be limited to within a predetermined range.

The semiconductor light emitting device 150 in the chamber 1300 may move toward the assembly device 1100 by the magnetic field generated by the assembly device 1100.

While moving toward the assembly device 1100, the semiconductor light emitting device 150 may enter the assembly hole 203 and come into contact with the substrate 200.

At this time, by the electric field applied by the assembly wiring 201, 202 formed on the substrate 200, the semiconductor light emitting device 150 in contact with the substrate 200 may be prevented from being separated by movement of the assembly device 1100.

In other words, the time required for each of the semiconductor light emitting devices 150 to be assembled on the substrate 200 may be drastically shortened by the self-assembly method using the electromagnetic field described above, so that large-area, high-pixel displays may be implemented more quickly and economically.

A predetermined solder layer (not shown) is further formed between the semiconductor light emitting device 150 assembled on the assembly hole 203 of the substrate 200 and the substrate 200, and may improve the bonding strength of the semiconductor light emitting device 150.

Afterwards, electrode wiring (not shown) is connected to the semiconductor light emitting device 150 and power may be applied.

Next, although not shown, at least one insulating layer may be formed through a post-process. At least one insulating layer may be transparent resin or resin containing a reflective material or a scattering material.

Meanwhile, embodiments increase the clearance tolerance between the side portion of the semiconductor light emitting device and the inner side of the hole by having the side portion of the semiconductor light emitting device have a shape corresponding to the shape of the inner side of the hole of the partition, so during self-assembly, assembly defects due to tilt of the semiconductor light emitting device can be prevented.

Descriptions omitted below can be easily understood from FIGS. 3 to 8 and the description given above in relation to the corresponding drawings.

First Embodiment

FIG. 9 is a cross-sectional view showing a display device according to the first embodiment.

Referring to FIG. 9, the display device 300 according to the first embodiment may include a substrate 310, a first assembly wiring 321, a second assembly wiring 322, a partition 340, and a semiconductor light emitting device 150. The display device 300 according to the first embodiment may include more components than these.

The substrate 310 may be a support member that supports components placed on the substrate 310 or a protection member that protects the components.

A plurality of pixels are defined on the substrate 310, and each pixel may include a first sub-pixel PX1, a second sub-pixel PX2, and a third sub-pixel PX3.

The first and second assembly wiring 321 and 322 may be disposed on the substrate 310. For example, it may contact the first and second assembly wirings 321 and 322 and the upper surfaces of the substrate 310, but this is not limited. For example, the first and second assembly wirings 321 and 322 may be arranged on the same layer. For example, the first and second assembly wirings 321 and 322 may be arranged side by side with each other. The first and second assembly wirings 321 and 322 may serve to assemble the semiconductor light emitting device 150 into the hole 365 in a self-assembly method. That is, during self-assembly, an electric field is generated between the first assembly wiring 321 and the second assembly wiring 322 by the voltage supplied to the first and second assembly wiring 321 and 322, and the moving semiconductor light emitting device 150 can be assembled in the hole 365 by the assembly device (1100 in FIG. 8) by the dielectrophoresis force formed by this electric field.

The partition 340 may be placed on the first and second assembly wiring 321 and 322. The partition 340 may have a plurality of holes 365 for assembling the semiconductor light emitting device 150. For example, the inner side 341 and bottom surface of the hole 365 may be exposed to the outside. For example, at least one hole 365 may be provided in each of the first to third sub-pixels (PX1, PX2, and PX3 in FIG. 4).

A thickness T1 of the partition 340 may be determined by considering a thickness (T11) of the semiconductor light emitting device 150. For example, the thickness T1 of the partition 340 may be smaller than the thickness T11 of the semiconductor light emitting device 150. Accordingly, an upper side portion of the semiconductor light emitting device 150 may be positioned higher than an upper surface of the partition 340. That is, the upper side portion of the semiconductor light emitting device 150 may protrude upward from the upper surface of the partition 340.

Meanwhile, the inner side 341 of the hole 365 of the partition 340 may have a first obtuse angle $\theta1$ with respect to the lower side. The lower side is the bottom surface of the hole 365, and may be, for example, the top surface of the first insulating layer 330 or the top surface of the second assembly wiring 322 as shown in FIG. 9. The first obtuse angle $\theta1$ may be an angle exceeding 90 degrees. Accordingly, the diameter of the hole 365 may increase from the bottom to the top. For example, the second diameter D2 on the upper side of the hole 365 may be larger than the first diameter D1 on the lower side of the hole 365. In this case, the first diameter D1 on the lower side of the hole 365 may be equal to or larger than the upper diameter D22 of the semiconductor light emitting device 150. For example, the diameter of the lower side portion of the semiconductor light emitting device 150 may be smaller than the diameter D22 of the upper side portion of the semiconductor light emitting device 150.

The distance between the lower side portion of the semiconductor light emitting device 150 and the lower inner side 341 of the hole 365 is the first distance L1, and the distance between the lower side portion of the semiconductor light emitting device 150 and the upper inner side 341 of the hole 365 may be the second distance L2.

The second distance L2 may be greater than the first distance L1. During self-assembly, the lower side portion of the semiconductor light emitting device 150 may enter the hole 365. At this time, the second distance L2 between the lower side portion of the semiconductor light emitting device 150 and the upper inner side 341 of the hole 365 is large, so the semiconductor light emitting device 150 can freely and safely enter the hole 365. When the lower side portion of the semiconductor light emitting device 150 is seated on the bottom surface of the hole 365 due to dielectrophoresis force, since the first distance L1 between the lower side of semiconductor light emitting device 150 and the lower inner side 341 of the hole 365 is also much larger than the separation margin when placing a general light emitting device (5 in FIGS. 1 and 2), the semiconductor light emitting device 150 may not be tilted in the hole 365.

The semiconductor light emitting device 150 may be placed in the hole 365. For example, the semiconductor light emitting device 150 may include a red semiconductor light emitting device disposed in the first sub-pixel PX1, a green semiconductor light emitting device disposed in the second sub-pixel PX2 and a blue semiconductor light emitting device disposed in the third sub-pixel PX3. The red semiconductor light emitting device may generate red light, a green semiconductor light emitting device may generate green light, and a blue semiconductor light emitting device may generate blue light. Accordingly, a color image may be displayed by red light emitted from the first sub-pixel PX1, green light emitted from the second sub-pixel PX2, and blue light emitted from the third sub-pixel PX3.

The semiconductor light emitting device 150 may be made of an inorganic semiconductor material. For example, the semiconductor light emitting device 150 may be made of a group 2-6 compound semiconductor material or a group 3-5 compound semiconductor material, but is not limited thereto.

As shown in FIG. 10, the semiconductor light emitting device 150 may include a first conductivity type semiconductor layer 151 containing a first conductivity type dopant, an active layer 152, and a second conductivity type semiconductor layer 153 containing a second conductivity type dopant. The active layer 152 may be placed under the first conductivity type semiconductor layer 151, and the second conductivity type semiconductor layer 153 may be placed under the active layer 152. For example, the first conductivity type dopant may be an n-type dopant, and the second conductivity type dopant may be a p-type dopant, but this is not limited. The first conductivity type semiconductor layer 151, the active layer 152, and the second conductivity type semiconductor layer 153 may constitute a light emitting part.

At least one side portion of the light emitting part 151, 152 and 153 may have a second obtuse angle $\theta2$ with respect to the lower side. The lower side may be the lower surface of the second conductivity type semiconductor layer 153. The second obtuse angle $\theta2$ may be an angle exceeding 90 degrees. Accordingly, at least one side portion of the light emitting parts 151, 152, and 153 may become larger from the bottom to the top. For example, when the first conductivity type semiconductor layer 151 is located on the second conductivity type semiconductor layer 153, the diameter of the first conductivity type semiconductor layer 151 may be larger than the diameter of the active layer 152 or the diameter of the second conductivity type semiconductor layer 153.

For example, at least one side portion of the light emitting parts 151, 152 and 153 may be parallel to the inner side 341 of the hole 365.

Meanwhile, the semiconductor light emitting device 150 may include a first electrode 154, a second electrode 155, and a passivation layer 157.

The first electrode 154 may be placed on the light emitting part 151, 152 and 153. For example, the first electrode 154 may include an ohmic layer, at least one electrode layer 1554, an adhesive layer, a magnetic layer, a bonding layer, etc.

For example, the first electrode 154 may be placed on one side of the upper surface of the light emitting parts 151, 152, and 153. Since the first electrode 154 is an opaque metal and may interfere with the transmission of light, it is necessary to minimize the placement area of the first electrode 154. Accordingly, the first electrode 154 may be placed on the upper surface of the light emitting parts 151, 152, and 153, that is, in a partial area of the upper surface of the first conductivity type semiconductor layer 151.

Meanwhile, as shown in FIG. 11, the first electrode 154 may be arranged along the edge of the upper surface of the light emitting parts 151, 152, and 153.

When the semiconductor light emitting device 150 has a circular shape, the first electrode 154 may have a ring shape like a donut when viewed from above. When the first electrode 154 has an annular shape, defective contact hole formation for arrangement of the electrode wiring 370 can be prevented.

For example, when the first electrode 154 is placed in a partial area of the upper surface of the light emitting part 151, 152 and 153, it is very difficult to form a contact hole in the second insulating layer 350 so that the first electrode 154 is exposed. On the other hand, when the first electrode 154 has an annular shape, even if the contact hole is formed so that only one area of the annular shape first electrode 154 is exposed, the electrode wiring 370 can be electrically connected to the first electrode 154 through the contact hole. That is, it is very easy to form a contact hole in the second insulating layer 350 so that one area of the annular first electrode 154 is exposed.

The passivation layer 157 may be disposed along the perimeter of the side portion of the light emitting parts 151, 152 and 153. The passivation layer 157 protects the light emitting parts 151, 152 and 153 and blocks leakage current flowing on the sides of the light emitting parts 151, 152 and 153 and electrical short circuits between the first conductivity type semiconductor layer 151 and the second conductivity type semiconductor layer 153 can be prevented. For example, the passivation layer 157 may be made of a material with excellent insulating properties, such as silicon oxide or silicon nitride.

The second electrode 155 may be placed below the light emitting part 151, 152 and 153. The second electrode 155 may be disposed along the perimeter of the side portion of the light emitting parts 151, 152, and 153. Since the second electrode 155 is disposed on the perimeter of side portion of the light emitting parts 151, 152, and 153, as shown in FIG. 9, electrical connection with the connection portion 360 is easy and electrical connection failure can be prevented.

For example, the second electrode 155 may be in contact with the lower and side surfaces of the second conductivity type semiconductor layer 153.

Meanwhile, the passivation layer 157 may be disposed on the side of the first conductivity type semiconductor layer 151 and the side of the active layer 152. Some ends of the passivation layer 157 may be placed on the side of the second conductivity type semiconductor layer 153. That is, some sides of the second conductivity type semiconductor layer 153 may be exposed to the outside by the passivation layer. A second electrode 155 may be in contact with some sides of the exposed second conductivity type semiconductor layer 153.

For example, the second electrode 155 may be disposed on the passivation layer 157. That is, the second electrode 155 may cover a portion of the passivation layer 157. As the second electrode 155 covers part of the passivation layer 157, the light emitting parts 151, 152 and 153 may be more safely protected by preventing moisture or foreign substances from penetrating through the boundary between the passivation layer 157 and the second electrode 155.

As shown in FIG. 12, the second electrode 155 may include a plurality of layers 1551, 1552, 1553, and 1554.

The second electrode 155 may include a conductive layer 1551. For example, the conductive layer 1551 may include a transparent conductive material that can have a current spreading effect, such as ITO, IZO, etc. For example, the conductive layer 1551 may be in contact with the lower surface of the second conductivity type semiconductor layer 153.

The thickness of the second conductivity type semiconductor layer 153 is thinner than the thickness of the first conductivity type semiconductor layer 151, so current may not flow uniformly throughout the entire area of the second conductivity type semiconductor layer 153. In this case, for example, the amount of hole generated in the second conductivity type semiconductor layer 153 may be much smaller than the amount of electron generated in the first conductivity type semiconductor layer 151. Since light is generated by recombination of electrons and holes in the active layer 152, electrons are sufficiently supplied to the active layer 152, so the amount of light in the active layer 152 may be determined by the amount of hole generated in the second conductivity type semiconductor layer 153. That is, as the amount of hole generated in the second conductivity type semiconductor layer 153 increases, the amount of light in the active layer 152 may also increase.

The conductive layer 1551 may have a current stretching effect. That is, when voltage is supplied to the conductive layer 1551, a current stretching effect may occur in which current flows along the surface of the conductive layer 1551. Since the conductive layer 1551 contacts the entire area of the lower surface of the second conductivity type semiconductor layer 153, so current flows through the conductive layer 1551 to the entire area of the second conductivity type semiconductor layer 153, allowing more holes to be generated. Since more generated holes are supplied to the active layer 152, the amount of light generated in the active layer 152 may increase.

Meanwhile, the second electrode 155 may include a reflective layer 1552. The reflective layer 1552 may be made of a metal with excellent reflective properties, such as aluminum (Al) or platinum (Pt).

The reflective layer 1552 may be disposed on the lower and sides of the light emitting parts 151, 152, and 153. For example, the reflective layer 1552 may be disposed along the perimeter of the side portion of the light emitting parts 151, 152, and 153. For example, the reflective layer 1552 may contact the lower surface of the conductive layer 1551 and the side of the second conductivity type semiconductor layer 153, but this is not limited.

The light generated by the active layer 152 is randomly reflected by the reflective layer 1552 on the lower and side surfaces of the light emitting part 151, 152, and 153 and is emitted more uniformly in various directions, enabling uniform light output.

Meanwhile, the second electrode 155 may include a magnetic layer 1553. The magnetic layer 1553 may be made of a metal with excellent magnetization characteristics, such as nickel (Ni) or cobalt (Co).

The magnetic layer 1553 may be disposed on the lower and sides of the light emitting parts 151, 152, and 153. For example, the magnetic layer 1553 may be disposed along the perimeter of the side portion of the light emitting parts 151, 152, and 153. For example, the magnetic layer 1553 may be in contact with the lower surface of the reflective layer 1552, but this is not limited. For example, the magnetic layer 1553 may be disposed between the conductive layer 1551 and the reflective layer 1552.

Meanwhile, the second electrode 155 may include an electrode layer 1554. The electrode layer 1554 may be made of a metal with excellent electrical conductivity, such as gold (Au) or copper (Cu).

The electrode layer 1554 may be disposed on the lower and sides of the light emitting parts 151, 152, and 153. For example, the electrode layer 1554 may be disposed along the perimeter of the side portion of the light emitting parts 151, 152, and 153. For example, the electrode layer 1554 may be in contact with the lower surface of the magnetic layer 1553, but this is not limited.

Although not shown, at least one or more layers may be added below the electrode layer 1554. Among such added layers, there may be a corrosion prevention layer to prevent corrosion of copper (Cu).

Although FIG. 10 shows a vertical type semiconductor light emitting device 150, the embodiment may be equally applied to a horizontal semiconductor light emitting device or a flip chip type semiconductor light emitting device.

Meanwhile, as shown in FIGS. 1 and 2, when the inner side of the assembly hole 3 has an obtuse angle θ1, while the side portion of the light emitting device 5 has an acute angle θ2, the separation margin between the side portion of the light emitting device 5 and the inner side of the assembly hole 3 is very small, so the light emitting device 5 is not properly assembled within the assembly hole 3 or is assembled distorted.

On the other hand, according to the embodiment, the inner side 341 of the hole 365 has a first obtuse angle θ1 with respect to the lower side, and at least one side portion 159 of the semiconductor light emitting device 150 may have a second obtuse angle θ2 with respect to the lower side. Since the inner side 341 of the hole 365 and the side portion 159 of the semiconductor light emitting device 150 have obtuse angles θ1 and θ2 exceeding 90 degrees, the separation margin between the side portion 159 of the semiconductor light emitting device 150 and the inner side 341 of the hole 365 is large, so that the semiconductor light emitting device 150 can be safely assembled in the hole 365 without being tilted.

As an example, the second obtuse angle θ2 may be equal to the first obtuse angle θ1. In this case, when the semiconductor light emitting device 150 is assembled in the hole 365, the side portion 159 of the semiconductor light emitting device 150 and the inner side 341 of the hole 365 may be parallel to each other. That is, the separation distance between the inner side 341 of the hole 365 and the side portion 159 of the semiconductor light emitting device 150 may be the same toward the top.

As another example, the second obtuse angle θ2 may be different from the first obtuse angle θ1. At this time, the difference between the first obtuse angle and the second obtuse angle may be less than 90°. In this case, the separation distance between the inner side 341 of the hole 365 and the side portion 159 of the semiconductor light emitting device 150 may decrease or increase toward the top.

For example, the inner side 341 of the hole 365 has a first slope with a first obtuse angle θ1, and at least one side portion 159 of the semiconductor light emitting device 150 may have a second slope having a second obtuse angle θ2. For example, the second slope may be the same or different from the first slope.

For example, the lower diameter D11 of the semiconductor light emitting device 150 may be 30% to 80% of the lower diameter D1 of the hole 365. As the lower diameter D11 of the semiconductor light emitting device 150 becomes smaller, the separation margin between the inner side 341 of the hole 365 and the side portion 159 of the semiconductor light emitting device 150 may increase. As the separation margin between the inner side 341 of the hole 365 and the side portion 159 of the semiconductor light emitting device 150 increases, the semiconductor light emitting device 150 can be properly assembled without being tilted within the hole 365.

When the lower diameter D11 of the semiconductor light emitting device 150 is small, the area of the magnetic layer 1553 of the second electrode 155 is reduced, so the magnetization intensity magnetized by the magnetic material of the assembly device (1100 in FIG. 8) may be reduced. When the magnetization strength of the semiconductor light emitting device 150 is small, it is difficult to easily control the movement of the semiconductor light emitting device 150 by the magnetic material of the assembly device (1100 in FIG. 8). In order to solve this problem, the embodiment may place the magnetic layer 1553 of the second electrode 155 on the lower and side surfaces of the light emitting layer to expand the area of the magnetic layer 1553 and increase the magnetization intensity.

Meanwhile, the display device 300 according to the first embodiment may include a first insulating layer 330, a connection portion 360, a second insulating layer 350, and electrode wiring 370.

The first insulating layer 330 may be disposed on the substrate 310. For example, the first insulating layer 330 may be made of an inorganic material or an organic material. For example, the first insulating layer 330 may be made of a material having a dielectric constant related to the dielectrophoresis force. Therefore, the dielectrophoresis force formed by the voltage applied to the first assembly wiring 321 and the second assembly wiring 322 may vary depending on the dielectric constant of the first insulating layer 330.

The connection portion 360 may be disposed along the perimeter of the side portion 159 of the semiconductor light emitting device 150 within the hole 365. The connection portion 360 may electrically connect the side portion 159 of the semiconductor light emitting device 150 and at least one assembly wiring among the first and second assembly wirings 321 and 322. For example, the connection portion 360 may electrically connect the second electrode 155 of the semiconductor light emitting device 150 to at least one assembly wiring among the first and second assembly wirings 321 and 322. In this case, at least one assembly wiring among the first and second assembly wirings 321 and 322 may be an electrode wiring.

The connection portion 360 may be made of a metal with excellent electrical conductivity and deposition characteristics. For example, the connection portion 360 may be made of one or more of Ti, Ni, Mo, MoTi, Cu, Cr, Al, etc. For example, the connection portion 360 may be formed using a deposition process such as sputtering, but this is not limited.

The second insulating layer 350 may be disposed on the semiconductor light emitting device 150 and the partition 340. For example, the second insulating layer 350 may be made of an organic material.

For example, at least one insulating layer among the first insulating layer 330, the partition 340, and the second insulating layer 350 may be formed of the same type of organic material, but this is not limited.

The electrode wiring 370 may be electrically connected to the upper part of the semiconductor light emitting device 150 through the second insulating layer 350. For example, the electrode wiring 370 may be electrically connected to the first electrode 154 of the semiconductor light emitting device 150 through the second insulating layer 350. Accordingly, at least one assembly wiring of the first assembly wiring 321 and the second assembly wiring 322 supplies a first voltage to the lower side portion of the semiconductor light emitting device 150, that is, the second electrode 155, through the connection portion 360, and a second voltage may be supplied to the upper side portion of the semiconductor light emitting device 150, that is, the first electrode 154, through the electrode wiring 370. Accordingly, current flows to the semiconductor light emitting device 150 due to the potential difference between the first voltage and the second voltage, so electrons generated in the first conductivity type semiconductor layer 151 and holes generated in the second conductivity type semiconductor layer 153 recombine in the active layer 152 to generate light of a specific wavelength.

Meanwhile, as shown in FIG. 9, the first assembly wiring 321 and the second assembly wiring 322 may be arranged in different layers. For example, the first assembly wiring 321 may be placed below the first insulating layer 330, and the second assembly wiring 322 may be placed on the first insulating layer 330. At this time, since the upper surface of the first insulating layer 330 and the upper surface of the second assembly wiring 322 are located on the same horizontal line within the hole 365, the semiconductor light emitting device 150 can be assembled in the hole 365 without tilting.

Since the first assembly wiring 321 and the second assembly wiring 322 are placed in different layers, even if the gap between the first assembly wiring 321 and the second assembly wiring 322 is minimized, an electrical short may not occur between the first assembly wiring 321 and the second assembly wiring 322 due to the first insulating layer 330. The gap between the first assembly wiring 321 and the second assembly wiring 322 may be minimized, making it possible to implement a display with high resolution or high definition.

For example, the first assembly wiring 321 may be disposed between the substrate 310 and the first insulating layer 330. The upper surface of the second assembly wiring 322 may be exposed to the outside within the hole 365. Therefore, when the connection portion 360 is disposed on the perimeter of the side portion 159 of the semiconductor light emitting device 150, the side of the connection portion 360 may be in contact with the second electrode 155 of the semiconductor light emitting device 150, and the lower side of the connection portion 360 may be in contact with the upper surface of the second assembly wiring 322. Accordingly, the second assembly wiring 322 and the second electrode 155 of the semiconductor light emitting device 150 may be electrically connected through the connection portion 360.

If the size of the semiconductor light emitting device 150 is reduced to micro level or less, the dielectrophoresis force may also be reduced, resulting in assembly defects.

Nevertheless, in the first embodiment, the shape of the semiconductor light emitting device 150 is made to correspond to the shape of the hole 365 of the partition 340, so during self-assembly, lighting defects can be prevented by preventing assembly defects such as tilting of the semiconductor light emitting device 150.

When arranging a general light emitting device (5 in FIGS. 1 and 2), when the light emitting device 5 is assembled at an angle within the assembly hole 3, a defective electrical connection occurs, resulting in poor lighting. In addition, when the dielectrophoresis force of the semiconductor light emitting device 150 assembled in the hole 365 is small, it is separated to the outside, and lighting defects occur due to the separation of the semiconductor light emitting device 150. In the first embodiment, considering the shape of the hole 365 having the inner side 341 of the first obtuse angle $\theta 1$, the side portion 159 of the semiconductor light emitting device 150 also has the second obtuse angle $\theta 2$, so the larger separation margin can be secured between the side portion 159 and the inner side 341 of the hole 365 and during self-assembly, tilting of the semiconductor light emitting device 150 can be prevented, thereby preventing lighting assembly defects. By preventing assembly defects, lighting defects can also be prevented.

According to the first embodiment, even though the size of the semiconductor light emitting device 150 is reduced, the magnetic layer 1553 of the second electrode 155 is arranged not only on the lower side but also on the side portion 159 of the semiconductor light emitting device 150, so the area of the magnetic layer 1553 can be maximized, and by increasing the magnetization intensity of the semiconductor light emitting device 150, the magnetization of the semiconductor light emitting device 150 is increased by the magnet during self-assembly, and the semiconductor light emitting device 150 can be easily moved to the corresponding hole 365 of the substrate 310, thereby improving the assembly rate.

According to the first embodiment, by placing the second electrode 155 on the side portion 159 of the semiconductor light emitting device 150, since it is electrically connected to the first assembly wiring 321 and/or the second assembly wiring 322 through the connection portion 360 disposed along the perimeter of the side portion 159 of the semiconductor light emitting device 150, so electrical connection is easy and electrical disconnection defects can be prevented.

According to the first embodiment, the size of the semiconductor light emitting device 150 can be reduced while preventing assembly defects, making it possible to implement a display with high resolution or high definition.

FIGS. 13 to 21 show a method of manufacturing a semiconductor light emitting device of the embodiment.

As shown in FIG. 13, after the first conductivity type semiconductor layer 151, the active layer 152, and the second conductivity type semiconductor layer 153 are grown on the wafer 1000, the second conductivity type semiconductor layer 153, the active layer 152, and the first conductivity type semiconductor layer 151 are mesa-etched using an etching process, thereby forming light emitting parts 151, 152, and 153. That is, not only vertical etching but also vertical etching may occur, so that less etching may occur on the lower side than on the upper side. The second conductivity type semiconductor layer 153 is etched the most, the active layer 152 is the next most etched, and the first conductivity type semiconductor layer 151 is the least visible. Accordingly, the diameter of the active layer 152 may be larger than the diameter of the second conductivity type semiconductor layer 153, and the diameter of the first conductivity type semiconductor layer 151 may be larger than the diameter of the active layer 152. In other words, the diameter may gradually increase from the top to the bottom of the light emitting parts 151, 152 and 153.

Although not shown, after the undoped layer is grown on the wafer 1000, a first conductivity type semiconductor layer 151, an active layer 152, and a second conductivity type semiconductor layer 153 may be grown on the undoped layer.

As shown in FIG. 14, a passivation layer 157 may be deposited around the light emitting parts 151, 152, and 153.

As shown in FIG. 15, by removing the passivation layer 157 located on the upper side portion of the light emitting parts 151, 152 and 153, the upper side portion of the light emitting part 151, 152 and 153, that is, the second conductivity type semiconductor layer 153, may be exposed to the outside.

As shown in FIG. 16, a conductive layer 1551 may be formed on the exposed second conductivity type semiconductor layer 153. The conductive layer 1551 may be formed using a deposition process such as sputtering.

As shown in FIG. 17, the passivation layer 157 formed on a part of the side of the second conductivity type semiconductor layer 153 may be removed, and a part of the side of the second conductivity type semiconductor layer 153 may be exposed to the outside. To this end, a mask layer may be formed on the passivation layer 157 that will not be removed. After the corresponding passivation layer 157 is removed, the mask layer may be removed, but this is not limited. The mask layer may be photoresist or an inorganic insulating material.

As shown in FIG. 18, a reflective layer 1552, a magnetic layer 1553, and an electrode layer 1554 may be formed on the upper side portion of the light emitting part 151, 152 and 153 and the side adjacent to the upper side.

Specifically, after the reflective layer 1552, magnetic layer 1553, and electrode layer 1554 are sequentially formed on the upper and side portions of the light emitting parts 151, 152 and 153, the electrode layer 1554, magnetic layer 1553, and reflective layer 1552 on the lower side of side portion of the light emitting parts 151, 152, and 153 may be sequentially removed. Accordingly, a reflective layer 1552, a magnetic layer 1553, and an electrode layer 1554 may be formed on the upper side portion of the light emitting part 151, 152 and 153 and the upper side portion of the light emitting part 151, 152 and 153.

The conductive layer 1551, the reflective layer 1552, the magnetic layer 1553, and the electrode layer 1554 may form the second electrode 155. Although not shown, the second electrode 155 may further include at least one layer in addition to the conductive layer 1551, the reflective layer 1552, the magnetic layer 1553, and the electrode layer 1554.

A semiconductor light emitting device (150 in FIG. 10) can be formed through the above series of processes.

As shown in FIG. 19, after the transfer substrate 1200 is attached to the upper side portion of the semiconductor light emitting device 150, the wafer 1000 may be separated using a laser lift-off (LLO) process. Accordingly, the semiconductor light emitting device 150 may be transferred to the transfer substrate 1200. The transfer substrate 1200 may be, for example, a substrate made of an organic material such as polyimide (PI), but is not limited thereto.

Although not shown, a bonding layer made of an organic material and a sacrificial layer such as aluminum (Al) may be provided between the transfer substrate 1200 and the semiconductor light emitting device 150. The semiconductor light emitting device 150 may be attached to the transfer substrate 1200 using a bonding layer.

As shown in FIG. 20, the transfer substrate 1200 can be turned over and positioned so that the first conductivity type semiconductor layer 151 faces upward.

A first electrode 154 may be formed on one side of the first conductivity type semiconductor layer 151. First, after the mask layer is formed in the central area of the first conductivity type semiconductor layer 151, the first electrode 154 may be formed on the first conductivity type semiconductor layer 151. Afterwards, the mask layer is removed, so that the first electrode 154 can be formed at the edge of the first conductivity type semiconductor layer 151. The first electrode 154 may include at least one layer. For example, the first electrode 154 may include an ohmic layer, an electrode layer 1554, an adhesive layer, a magnetic layer 1553, a bonding layer, etc.

As shown in FIG. 21, by removing the transfer substrate 1200, a semiconductor light emitting device 150 having a first electrode 154 and a second electrode 155 can be manufactured. For example, the semiconductor light emitting device 150 may be separated from the transfer substrate 1200 by etching the sacrificial layer using a wet etching process.

Second Embodiment

FIG. 22 is a cross-sectional view showing a display device according to the second embodiment.

The second embodiment is the same as the first embodiment except for the arrangement of the first assembly wiring 321 and the second assembly wiring 322. In the second embodiment, components having the same shape, structure, and/or function as those of the first embodiment are assigned the same reference numerals and detailed descriptions are omitted.

Referring to FIG. 22, the display device 300A according to the second embodiment may include a substrate 310, a first assembly wiring 321, a second assembly wiring 322, a first insulating layer 330, a partition 340, a semiconductor light emitting device 150, a connection portion 360, a second insulating layer 350 and an electrode wiring 370.

The substrate 310, the first insulating layer 330, the partition 340, the semiconductor light emitting device 150, the connection portion 360, the second insulating layer 350, and the electrode wiring 370 may be easily understood from the description of the first embodiment, so detailed description is omitted.

The first assembly wiring 321 and the second assembly wiring 322 may be placed on the same layer.

For example, the first assembly wiring 321 and the second assembly wiring 322 may be disposed on the substrate 310. For example, first assembly wiring 321 and second assembly wiring 322 may be placed below the first insulating layer 330.

For example, the thickness of the first assembly wiring 321 and the thickness of the second assembly wiring 322 may be the same. In this way, when the first insulating layer 330 is disposed on the first assembly wiring 321 and the second assembly wiring 322 having the same thickness, the upper surface of the first insulating layer 330 may be located on the horizontal line. That is, the top surface of the first insulating layer 330 on the first assembly wiring 321 and the top surface of the first insulating layer 330 on the second assembly wiring 322 may have the same height.

When the semiconductor light emitting device 150 is assembled in the hole 365 during self-assembly, the lower side portion of the semiconductor light emitting device 150 may be in contact with the upper surface of the first insulating layer 330 on the first assembly wiring 321 and the upper surface of the first insulating layer 330 on the second assembly wiring 322. Since the top surface of the first insulating layer 330 on the first assembly wiring and the top surface of the first insulating layer 330 on the second assembly wiring 322 have the same height, the semiconductor light emitting device 150 in contact with the upper surface of the first insulating layer 330 on the first assembly wiring 321 and the upper surface of the first insulating layer 330 on the second assembly wiring 322 can be maintained in a horizontal state without being tilted. Since the semiconductor light emitting device 150 between pixels maintains the same horizontal state, uniform luminance can be obtained between pixels, thereby improving image quality.

Since the first assembly wiring 321 and second assembly wiring 322 are placed below the first insulating layer 330, the connection portion 360 may not be connected to the first assembly wiring 321 and the second assembly wiring 322. In order to solve this problem, the first insulating layer 330 corresponding to the space between the side portion 159 of the semiconductor light emitting device 150 and the inner side 341 of the hole 365 is removed to form a contact hole, so the first assembly wiring 321 and/or the second assembly wiring 322 may be exposed to the outside. In this case, when the connection portion 360 is disposed in the space between the side portion 159 of the semiconductor light emitting device 150 and the inner side 341 of the hole 365, the connection portion 360 may be electrically connected to the first assembly wiring 321 and/or the second assembly wiring 322 through a contact hole in the first insulating layer 330.

According to the second embodiment, since the first assembly wiring 321 and the second assembly wiring 322 are arranged on the same layer, the dielectrophoresis force formed between the first assembly wiring 321 and the second assembly wiring 322 is uniform, and the semiconductor light emitting device 150 may be assembled in the correct position within the hole 365 without being biased to one side.

Meanwhile, in the above, top emission, in which light is emitted in the upward direction, was explained. However, in the embodiment, bottom light emission in which light is emitted in a downward direction is also possible. That is, light may be emitted downward through the substrate 310.

For this purpose, the reflective layer 1552 of the second electrode 155 may be omitted. Alternatively, the remaining layers 1552, 1553, and 1554 except the conductive layer 1551 in the second electrode 155 may be omitted. Meanwhile, the first electrode 154 is disposed on the entire area of the first conductivity type semiconductor layer 151 and may include a reflective layer with excellent reflection characteristics. In addition, the first assembly wiring 321 and the second assembly wiring 252 may be made of a transparent conductive material or a very thin metal that allows light to pass through. Accordingly, light generated in the active layer 152 may be reflected downward by the first electrode 154. Light generated in the active layer 152 may be emitted to the outside of the substrate 310 through the second conductivity type semiconductor layer 153 and the second electrode 1555.

The above detailed description should not be construed as restrictive in any respect and should be considered illustrative. The scope of the embodiments should be determined by reasonable interpretation of the appended claims, and all changes within the equivalent scope of the embodiments are included in the scope of the embodiments.

INDUSTRIAL APPLICABILITY

The embodiment may be adopted in the field of displays that display images or information. Embodiments may be adopted in the field of displays that display images or information using a semiconductor light emitting device. The semiconductor light emitting device may be a micro-level semiconductor light emitting device or a nano-level semiconductor light emitting device.

For example, the embodiment can be adopted in TVs, signage, smart phones, mobile phones, mobile terminals, HUDs for automobiles, backlight units for laptops, and display devices for VR or AR.

The invention claimed is:

1. A display device, comprising:
   a substrate;
   a first and second assembly wirings on the substrate;
   a first insulating layer between the first assembly wiring and the second assembly wiring;
   a partition having a hole on the first and second wirings; and
   a semiconductor light emitting device in the hole;
   wherein the hole comprises an inner side with a first obtuse angle to a lower side thereof,
   wherein the semiconductor light emitting device comprises at least one side having a second obtuse angle with respect to a lower side thereof,
   wherein the semiconductor light emitting device comprises:
      a light emitting part;
      a first electrode on the light emitting part;
      a second electrode below the light emitting part; and
      a passivation layer around a side of the light emitting part,
      wherein the second electrode is disposed around the side of the light emitting part,
      wherein the second electrode is direct contact with a bottom surface of the light emitting part and a portion of a side surface of the light emitting part, and
   wherein the first insulating layer is disposed on a top surface of the first assembly wiring and under a bottom surface of the second assembly wiring.

2. The display device according to claim 1, wherein the second obtuse angle is the same as the first obtuse angle.

3. The display device according to claim 1, wherein the second obtuse angle is different from the first obtuse angle, and
   wherein a difference between the first obtuse angle and the second obtuse angle is less than 90°.

4. The display device according to claim 1, wherein the second electrode is disposed on the passivation layer.

5. The display device according to claim 1, wherein the second electrode comprises a reflective layer, and
   wherein the reflective layer is disposed on a perimeter of the portion of the side surface of the light emitting part.

6. The display device according to claim 1, wherein the second electrode comprises a magnetic layer, and wherein the magnetic layer is disposed on a perimeter of the portion of the side surface of the light emitting part.

7. The display device according to claim 1, wherein the second electrode comprises an electrode layer, and wherein the electrode layer is disposed on a perimeter of the portion the side surface of the light emitting part.

8. The display device according to claim 1, wherein the first electrode is disposed on one side of an upper surface of the light emitting part.

9. The display device according to claim 1, wherein a side of the semiconductor light emitting device is parallel to the inner side of the hole.

10. The display device according to claim 1, further comprising a connection portion in contact with the second electrode along the perimeter of the portion of the side surface of the semiconductor light emitting device within the hole.

11. The display device according to claim 10, wherein the first and second assembly wirings are arranged in different layers, and wherein the connection portion is connected to at least one assembly wiring of the first and second assembly wirings.

12. The display device according to claim 10, further comprising a second insulating layer on the partition and the semiconductor light emitting device; and an electrode wiring in contact with the first electrode through the second insulating layer.

13. The display device according to claim 1, wherein a thickness of the partition is smaller than a thickness of the semiconductor light emitting device.

14. The display device according to claim 1, wherein the semiconductor light emitting device comprises a vertical type semiconductor light emitting device.

15. A display device, comprising:

a substrate;

a first and second assembly wirings on the substrate;

a partition having a hole on the first and second wirings; and a semiconductor light emitting device in the hole; and a first insulating layer between the first assembly wiring and the second assembly wiring, wherein the hole comprises an inner side with a first obtuse angle to a lower side thereof, wherein the semiconductor light emitting device comprises at least one side having a second obtuse angle with respect to a lower side thereof, wherein the semiconductor light emitting device comprises:

a light emitting part;

a first electrode on the light emitting part;

a second electrode below the light emitting part; and a passivation layer around a side of the light emitting part, wherein the second electrode is disposed around the side of the light emitting part, and wherein the first insulating layer is disposed on a top surface of the first assembly wiring and under a bottom surface of the second assembly wiring.

16. The display device according to claim 15, wherein a top surface of the first assembly wiring is disposed at a different height from a top surface of the second assembly wiring.

17. The display device according to claim 1, wherein a top most surface of the first insulating layer is disposed under the second electrode of the light emitting part.

18. The display device according to claim 1, wherein the first insulating layer is disposed between the second electrode of the light emitting part and the first assembly wiring.

19. The display device according to claim 16, wherein a topmost surface of the first insulating layer is disposed under the second electrode of the light emitting part.

20. The display device according to claim 16, wherein the first insulating layer is disposed between the second electrode of the light emitting part and the first assembly wiring.

* * * * *